United States Patent
Donowho et al.

(10) Patent No.: US 7,746,637 B2
(45) Date of Patent: *Jun. 29, 2010

(54) ELECTRONIC EQUIPMENT ENCLOSURE WITH EXHAUST AIR DUCT AND ADJUSTABLE FILLER PANEL ASSEMBLIES

(75) Inventors: D. Brian Donowho, Austin, TX (US); Richard Evans Lewis, II, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 12/123,459

(22) Filed: May 19, 2008

(65) Prior Publication Data
US 2008/0316703 A1 Dec. 25, 2008

Related U.S. Application Data

(60) Provisional application No. 60/938,701, filed on May 17, 2007, provisional application No. 60/939,048, filed on May 18, 2007.

(51) Int. Cl.
*H05K 7/20* (2006.01)
(52) U.S. Cl. ............ 361/690; 361/695; 361/679.48; 361/679.49; 454/184
(58) Field of Classification Search ......... 361/690–697, 361/721–727, 831; 165/121–127, 185, 104.33; 454/57, 58, 184, 187, 228, 229, 236, 215, 454/225; 312/223.2, 223.3, 116, 118, 236; 174/35 R, 35 MS, 51, 51.2, 52.1
See application file for complete search history.

(56) References Cited

U.S. PATENT DOCUMENTS 3,192,306 A 6/1965 Skonnard (Continued)

FOREIGN PATENT DOCUMENTS

DE 2509487 A 9/1976

(Continued)

OTHER PUBLICATIONS

Rasmussen, Neil, "Air Distribution Architecture Options for Mission Critical Facilities", White Paper #55, 2003, pp. 1-13, Revision 1, American Power Conversion (APC), West Kingston, Rhode Island.

(Continued)

*Primary Examiner*—Michael V Datskovskiy
(74) *Attorney, Agent, or Firm*—Tillman Wright, PLLC; James D. Wright; Chad D. Tillman

(57) ABSTRACT

An electronic equipment enclosure includes a frame structure, one or more enclosure panels mounted on the frame structure, an exhaust duct, and a plurality of adjustable filler panel assemblies. The frame structure and the one or more enclosure panels together define an enclosure. The exhaust duct is substantially the same height as the enclosure and has an air inlet opening formed therein for receipt of exhaust air from equipment mounted in the enclosure. The plurality of adjustable filler panel assemblies selectively block portions of the air inlet opening in order to create a custom-fit air inlet opening for a particular piece of equipment so that exhaust air from the equipment does not flow back into the enclosure after entering the exhaust duct.

24 Claims, 19 Drawing Sheets

U.S. PATENT DOCUMENTS

| | | | |
|---|---|---|---|
| 4,467,584 A | 8/1984 | Crites et al. | |
| 4,541,219 A | 9/1985 | Parker | |
| 4,592,602 A | 6/1986 | Kuster et al. | |
| 4,774,631 A | 9/1988 | Okuyama et al. | |
| 5,165,770 A | 11/1992 | Hahn | |
| 5,216,579 A | 6/1993 | Basara et al. | |
| 5,250,752 A | 10/1993 | Cutright | |
| 5,294,748 A | 3/1994 | Schwenk et al. | |
| 5,528,454 A | 6/1996 | Niklos | |
| 5,544,012 A | 8/1996 | Koike | |
| 5,639,150 A | 6/1997 | Anderson et al. | |
| 5,671,805 A | 9/1997 | Stahl et al. | |
| 5,695,263 A | 12/1997 | Simon et al. | |
| 5,791,498 A | 8/1998 | Mills | |
| 5,806,945 A | 9/1998 | Anderson et al. | |
| 5,806,946 A | 9/1998 | Benner et al. | |
| 5,851,143 A * | 12/1998 | Hamid | 454/57 |
| 5,941,767 A | 8/1999 | Fukuda | |
| 5,995,368 A | 11/1999 | Lee et al. | |
| 6,034,873 A | 3/2000 | Stahl et al. | |
| 6,044,193 A | 3/2000 | Szentesi et al. | |
| 6,067,233 A | 5/2000 | English et al. | |
| D432,098 S | 10/2000 | Nelson et al. | |
| 6,163,454 A * | 12/2000 | Strickler | 361/695 |
| 6,198,628 B1 | 3/2001 | Smith | |
| 6,373,721 B2 | 4/2002 | Lecinski et al. | |
| 6,462,944 B1 | 10/2002 | Lin | |
| 6,554,697 B1 | 4/2003 | Koplin | |
| 6,557,357 B2 | 5/2003 | Spinazzola et al. | |
| 6,574,970 B2 | 6/2003 | Spinazzola et al. | |
| 6,601,932 B1 | 8/2003 | Helgenberg et al. | |
| 6,616,524 B2 | 9/2003 | Storck et al. | |
| 6,652,373 B2 * | 11/2003 | Sharp et al. | 454/184 |
| 6,745,579 B2 | 6/2004 | Spinazzola et al. | |
| 6,788,535 B2 | 9/2004 | Dodgen et al. | |
| 6,819,563 B1 | 11/2004 | Chu et al. | |
| 6,854,284 B2 | 2/2005 | Bash | |
| 6,867,967 B2 | 3/2005 | Mok | |
| 7,011,576 B2 * | 3/2006 | Sharp et al. | 454/184 |
| 7,033,267 B2 * | 4/2006 | Rasmussen | 454/184 |
| 7,074,123 B2 | 7/2006 | Bettridge et al. | |
| 7,112,131 B2 * | 9/2006 | Rasmussen et al. | 454/184 |
| 7,154,748 B2 * | 12/2006 | Yamada | 361/690 |
| 7,182,208 B2 * | 2/2007 | Tachibana | 211/26 |
| 7,236,362 B2 | 6/2007 | Wang et al. | |
| 7,255,640 B2 | 8/2007 | Aldag et al. | |
| 7,259,963 B2 | 8/2007 | Germagian et al. | |
| 7,286,345 B2 * | 10/2007 | Casebolt | 361/679.48 |
| 7,293,666 B2 | 11/2007 | Mattlin et al. | |
| 7,309,279 B2 * | 12/2007 | Sharp et al. | 454/184 |
| 7,349,209 B2 * | 3/2008 | Campbell et al. | 361/694 |
| 7,425,678 B2 | 9/2008 | Adducci et al. | |
| 7,427,713 B2 | 9/2008 | Adducci et al. | |
| 7,472,970 B2 | 1/2009 | Bergesch et al. | |
| 7,485,803 B2 | 2/2009 | Adducci et al. | |
| 7,486,512 B2 * | 2/2009 | Campbell et al. | 361/694 |
| 7,495,169 B2 | 2/2009 | Adducci et al. | |
| 7,504,581 B2 | 3/2009 | Adducci et al. | |
| 7,508,663 B2 * | 3/2009 | Coglitore | 361/695 |
| 7,542,287 B2 | 6/2009 | Lewis, II et al. | |
| 7,604,535 B2 | 10/2009 | Germagian et al. | |
| 2004/0007348 A1 | 1/2004 | Stoller | |
| 2004/0099747 A1 | 5/2004 | Johnson et al. | |
| 2004/0190270 A1 | 9/2004 | Aldag et al. | |
| 2004/0201335 A1 | 10/2004 | Davis | |
| 2005/0029910 A1 | 2/2005 | Woods | |
| 2005/0170770 A1 | 8/2005 | Johnson et al. | |
| 2005/0225936 A1 | 10/2005 | Day | |
| 2006/0276121 A1 | 12/2006 | Rasmussen | |
| 2008/0062654 A1 | 3/2008 | Mattlin et al. | |
| 2008/0068791 A1 | 3/2008 | Ebermann | |
| 2008/0316702 A1 | 12/2008 | Donowho et al. | |
| 2009/0129013 A1 | 5/2009 | Donowho et al. | |
| 2009/0190307 A1 | 7/2009 | Krietzman | |
| 2009/0227197 A1 | 9/2009 | Lewis, II et al. | |
| 2009/0239460 A1 | 9/2009 | Lucia et al. | |
| 2009/0239461 A1 | 9/2009 | Lewis, II et al. | |

FOREIGN PATENT DOCUMENTS

| | | |
|---|---|---|
| DE | 20207426 U1 | 9/2002 |
| JP | 02000286580 | 10/2000 |
| JP | 2004-2000594 | 7/2004 |
| JP | 2004-252758 | 9/2004 |
| WO | 2006055506 A2 | 5/2006 |
| WO | 2008144678 A1 | 11/2008 |
| WO | 2009089008 A2 | 7/2009 |
| WO | 2009103090 A2 | 8/2009 |
| WO | 2009103090 A3 | 10/2009 |

OTHER PUBLICATIONS

Information Disclosure Statement (IDS) Letter Regarding Common Patent Application(s), submitted by Applicant on Sep. 18, 2009.

Information Disclosure Statement (IDS) Letter Regarding Common Patent Application(s), dated Nov. 3, 2009.

"International Search Report" and "Written Opinion" of the International Search Authority (Korean Intellectual Property Office) in Chatsworth Products, Inc. et al., International Patent Application Serial No. PCT/US2009/034338, filed on Feb. 17, 2003 mailed on Sep. 1, 2009 and completed on Aug. 31, 2009, 7 pages.

"International Search Report" and "Written Opinion of the International Search Authority" (Korean Intellectual Property Office) in Chatsworth Products, Inc. et al., International Patent Application Serial No. PCT/US2008/064174, filed May 19, 2008, 9 pages.

Chatsworth Products, Inc., "Thermal Management Solutions", Signature Solutions Brochure, Revision dated Mar. 2008, 6 pages, www.chatsworth.com/passivecooling.

* cited by examiner

ELECTRONIC EQUIPMENT ENCLOSURE WITH EXHAUST AIR DUCT AND ADJUSTABLE FILLER PANEL ASSEMBLIES

CROSS-REFERENCE TO RELATED APPLICATION

For purposes of the United States, the present application is a U.S. nonprovisional patent application of, and claims priority under 35 U.S.C. §119(e) to, U.S. provisional patent application Ser. No. 60/938,701, filed May 17, 2007 and entitled "ADJUSTABLE FILLER PANEL ASSEMBLY," and U.S. provisional patent application Ser. No. 60/939,048, filed May 18, 2007 and also entitled "ADJUSTABLE FILLER PANEL ASSEMBLY," each of which is incorporated by reference herein.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention generally relates to air flow management within an electronic equipment enclosure, and in particular to, adjustable panels that enable selective directing of exhausted air within an electronic equipment enclosure.

2. Background

Racks, frames, cabinets and the like for supporting computer and other electronic equipment are well known. Such support apparatus are often partially or fully enclosed, either directly through the use of doors and panels mounted directly thereon, or indirectly by lining several such apparatuses up in a row such that the sides of each rack are immediately adjacent another rack.

As is also well known, the electronic equipment mounted therein tends to generate large amounts of heat that need to be exhausted away from the equipment effectively in order to maintain the equipment in proper operating order or to prevent damage thereto. As equipment has become more densely packed with electronics, the quantities of heat have continued to increase in recent years. Heat management has thus become a significant issue confronting today's rack, cabinet, frame and enclosure manufacturers, the manufacturers of the electronic equipment, and the users of such equipment.

Each piece of equipment is often enclosed within an individual chassis or housing that includes a location, typically referred to as an exhaust grille, where air that has been circulated therethrough is exhausted. The heated air is frequently forced or forcibly drawn out of the various active pieces of equipment through exhaust grilles of the equipment by internal fans, often supplemented by separate fans mounted in or on the enclosure 10. In many pieces of equipment, the exhaust grille is located on the rear of the equipment, and the equipment is often cooled by bringing cool air to the front of the equipment and exhausted through the rear, often through a door or through exhaust openings in a panel. Other equipment uses the opposite configuration, wherein cool air is brought to the rear of the equipment and exhausted through the front; this may be handled generally similarly as the rear exhaust except that the front and rear of the cabinet are generally reversed.

However, other equipment is arranged to receive cold air from the side and to exhaust heated air from the opposite side. For example, a common piece of electronic equipment in modern computer networks is a switch. Switches tend to generate a significant amount of heat, and therefore are of particular concern in exhausting heat from an electronic equipment enclosure, and at least some are manufactured with inlets on one side and exhaust grilles on the other side. Such equipment requires different treatment than front/rear exhaust equipment.

Currently, in order to remove heated switch exhaust air from the side of an electronic equipment enclosure, the switch exhaust grille is coupled with or connected to an individual exhaust duct that is specifically designed and sized to fit the particular type of switch being used. It is important that the switch grille and the exhaust duct inlet are similarly sized so that exhaust air is routed outside of the enclosure through the duct rather than being released into the interior of the enclosure where it would adversely affect the equipment stored therein. Because of the individual sizing, a different exhaust duct must be used for differently sized switches.

Such particularity in exhaust duct size and configuration is a significant drawback in modern networked computer systems wherein switches are often changed to update or change an existing system to a new system. One problem is the inefficiencies that are created by using different exhaust ducts for different switches. Another problem is the amount of time that it takes to change out a switch because the entire enclosure has to be dismantled to remove and change out the exhaust duct as well. Further, although much of the discussion herein focuses on switches as an exemplary piece of equipment, it is to be understood that similar problems exist with all heat generating electronic equipment. In addition, the amount and rate of air that may be exhausted from a particular equipment chassis is limited by the size of the individual exhaust duct being used. Often the flow of exhausted air is impeded by the volume of the exhaust duct thereby adversely affecting the temperature of the equipment to which the duct is attached.

A versatile, adjustable solution that enables the use of a universal exhaust duct with multiple kinds and sizes of electronic equipment chassis, and particularly multiple sizes of switch chassis, is needed. In addition, a solution that allows for the use of a relatively larger volume exhaust duct is needed.

SUMMARY OF THE PRESENT INVENTION

Broadly defined, the present invention according to one aspect is an adjustable filler panel assembly for use in an electronic equipment enclosure that includes a first panel, adapted to block airflow, having a plurality of pairs of horizontally aligned adjustment openings formed therein; and a second panel, adapted to block airflow, having at least one pair of horizontally aligned attachment members disposed near an end of the panel. The first and second panels may be connected to one another in an overlapping arrangement to form an air-blocking panel assembly with the attachment members of the second panel being aligned with and connected to a pair of adjustment openings of the first panel. The first panel and the second panel are telescopically adjustable relative to one another using the adjustment openings of the first panel such that a length of the air-blocking panel assembly is selectively adjustable to fill at least a portion of an opening in the electronic equipment enclosure, thereby blocking air from flowing through the opening.

In features of this aspect, the second panel may have a single pair of horizontally aligned attachment members disposed near an end of the panel; the adjustable filler panel assembly may further comprise a pair of side flanges connected to each of the first and second panels, the side flanges further including at least one pair of elongate slots; the pair of side flanges of the first panel may include more than one pair of elongate slots; the adjustable filler panel assembly may further comprise an end flange connected to each of the first and second panels; the orientation of the first and second panels in relation to one another may be altered in order to facilitate vertical adjustment of the assembly; the first and second panels may be reconfigurable from a close-ended configuration to an open-ended configuration; the first and second panels may be reconfigurable by rotating one panel 180 degrees relative to the other panel; and the plurality of pairs of horizontally aligned adjustment openings in the first panel may be separated vertically by one RMU.

The present invention according to another aspect is an exhaust duct configured to be mounted in an electronic equipment enclosure that includes a box-like structure having an inner side wall and an outer side wall and further having a front, a rear, a top and a bottom, at least some of which are defined by walls of the box-like structure; an air inlet opening arranged in the inner side wall for receipt of exhaust air from equipment mounted in an enclosure when the exhaust duct is mounted therein; and at least one adjustable filler panel assembly. Each of the at least one adjustable filler panel assemblies is attachable to the inner side wall in any of a plurality of mounting locations, for selectively blocking a portion of the air inlet opening in order to prohibit air exhausted into the duct from flowing back into the enclosure when the exhaust duct is mounted therein.

In features of this aspect, the plurality of mounting locations, in which each of the adjustable filler panel assemblies may be attached, may be distributed vertically along the air inlet opening of the exhaust duct; each adjustable filler panel assembly may include a first panel and a second panel that are telescopically adjustable relative to one another such that a length of the filler panel assembly is selectively adjustable to fill a portion of the air inlet opening, thereby blocking air from flowing through the opening; the air inlet opening may be generally rectangular in shape; the air inlet opening may include a pair of vertical flanges to which each of the at least one adjustable filler panel assembly is adjustably mounted; the vertical flanges may each include a linear arrangement of mounting apertures to which the at least one adjustable filler panel assembly is adjustably mounted, each separated from the next by ½ RMU; the vertical flanges may each include a linear arrangement of mounting apertures to which the at least one adjustable filler panel assembly is adjustably mounted, each separated from the next by one RMU; the internal exhaust duct may be configured to be positioned between a frame structure of the enclosure and an expansion kit panel of the enclosure; the internal exhaust duct may be configured to be positioned inside a frame structure of the enclosure; the internal exhaust duct may include a top wall, a bottom wall and a front wall, and may further include a rear air outlet opening through which exhaust air is routed; the internal exhaust duct may include a top wall, a bottom wall and a rear wall, and may further include a front air outlet opening through which exhaust air is routed; the internal exhaust duct may include a top wall, a bottom wall, a front wall and a rear wall, and wherein the top wall may define an air outlet opening through which exhaust air is routed; the internal exhaust duct may include a top wall, a bottom wall, a front wall and a rear wall, and wherein the bottom wall may define an air outlet opening through which exhaust air is routed; and the first and second panels may be adjustable relative to each other in one RMU increments.

The present invention according to another aspect is an exhaust duct configured to be mounted in an electronic equipment enclosure that includes a box-like structure having an inner side wall, an outer side wall, a front wall, a top wall, and a bottom wall, the inner side wall including a pair of vertical side flanges. The exhaust duct further includes an air inlet opening, defined in the inner side wall by the vertical side flanges, for receipt of exhaust air from equipment mounted in an enclosure when the exhaust duct is mounted therein; an air outlet opening defined at the rear of the box-like structure; and a plurality of adjustable filler panel assemblies. Each adjustable filler panel assembly is attachable to the vertical side flanges of the inner side wall in any of a plurality of mounting locations, each includes a first panel and a second panel arranged in overlapping relationship, and each is vertically adjustable, for selectively blocking a portion of the air inlet opening in order to prohibit air exhausted into the duct from flowing back into an electronic equipment enclosure when the exhaust duct is mounted therein.

In features of this aspect, the plurality of adjustable filler panel assemblies may include at least one adjustable filler panel assembly of a first size and at least one adjustable filler panel assembly of a second size, thereby providing a custom-fit exhaust opening for a particular piece of equipment so that exhaust air from the equipment does not flow back into the enclosure after entering the exhaust duct.

The present invention according to another aspect is an electronic equipment enclosure that includes a frame structure; one or more enclosure panels mounted on the frame structure, the frame structure and the one or more enclosure panels together defining an enclosure; an exhaust duct which is substantially the same height as the enclosure and has an air inlet opening formed therein for receipt of exhaust air from equipment mounted in the enclosure; and at least one adjustable filler panel assembly for selectively blocking a portion of the air inlet opening in order to prohibit air exhausted into the duct from flowing back into the enclosure.

In features of this aspect, the exhaust duct may be disposed internally relative to the one or more enclosure panels; the adjustable filler panel assembly may include a first panel and a second panel that are telescopically adjustable relative to one another such that a length of the filler panel assembly is selectively adjustable to fill a portion of the air inlet opening, thereby blocking air from flowing through the opening; the internal exhaust duct may be generally box-like in shape and may include an air outlet opening; the air inlet opening may be generally rectangular in shape; the air inlet opening may include a pair of vertical flanges to which the at least one adjustable filler panel assembly is adjustably mounted; the vertical flanges may each include a linear arrangement of mounting apertures to which the at least one adjustable filler panel assembly is adjustably mounted, each separated from the next by ½ RMU; the vertical flanges may each include a linear arrangement of mounting apertures to which the at least one adjustable filler panel assembly is adjustably mounted, each separated from the next by one RMU; the internal exhaust duct may be disposed between the frame structure of the enclosure and an expansion kit panel of the enclosure; the internal exhaust duct may be disposed inside the frame structure of the enclosure; the internal exhaust duct may route exhaust air to the rear of the enclosure and through the air outlet opening; the first and second panels of each adjustable filler panel assembly may be connected to one another in an overlapping arrangement to form an air-blocking panel assembly with the attachment members of the second panel being aligned with and connected to a pair of adjustment openings of the first panel; the first panel may have a plurality of pairs of horizontally aligned adjustment openings formed therein, and the second panel may have at least one pair of horizontally aligned attachment members disposed near an end of the panel; the second panel may have a single pair of horizontally aligned attachment members disposed near an end of the panel; the plurality of pairs of horizontally aligned adjustment openings in the first panel may be separated vertically by one RMU; the adjustable filler panel assembly may further include a pair of side flanges connected to each of the first and second panels, the side flanges further including at least one pair of elongate slots; the pair of side flanges of the first panel may include more than one pair of elongate slots; the electronic equipment enclosure may further include a flange at one end of each of the first and second panels; the orientation of the first and second panels in relation to one another may be altered in order to facilitate vertical adjustment of the assembly; each adjustable filler panel assembly may be reconfigurable from a close-ended configuration to an open-ended configuration; and the first and second panels may be reconfigurable between the close-ended configuration and the open-ended configuration by rotating one panel 180 degrees relative to the other panel.

The present invention according to another aspect is an electronic equipment enclosure that includes a frame structure; one or more enclosure panels mounted on the frame structure, the frame structure and the one or more enclosure panels together defining an enclosure; an exhaust duct, disposed internally relative to the one or more enclosure panels, that has an air inlet opening formed therein for receipt of exhaust air from equipment mounted in the enclosure; and at least one adjustable filler panel assembly for selectively blocking a portion of the air inlet opening in order to prohibit air exhausted into the duct from flowing back into the enclosure.

In features of this aspect, the internal exhaust duct may be substantially the same height as the enclosure.

The present invention according to another aspect is a method of customizing air flow in an electronic equipment enclosure that includes providing a frame structure having one or more enclosure panels mounted thereon, the one or more enclosure panels together defining an enclosure; installing an exhaust duct in the enclosure, the exhaust duct having an air inlet opening formed therein for receipt of exhaust air from equipment mounted in the enclosure; and installing an adjustable filler panel assembly in the enclosure to selectively block a portion of the air inlet opening.

In features of this aspect, the step of installing an adjustable filler panel assembly may include installing the adjustable filler panel assembly in the vicinity of an exhaust grille on a side of a piece of electronic equipment mounted in the electronic equipment enclosure without blocking the exhaust grille, thereby encouraging air flow from the exhaust grille through an exhaust opening partially defined by the adjustable air filler assembly in the air inlet opening.

The present invention according to another aspect is an electronic equipment enclosure that includes a frame structure; one or more enclosure panels mounted on the frame structure, the frame structure and the one or more enclosure panels together defining an enclosure; an exhaust duct which is substantially the same height as the enclosure and has an air inlet opening formed therein for receipt of exhaust air from equipment mounted in the enclosure; and a plurality of adjustable filler panel assemblies for selectively blocking portions of the air inlet opening in order to create a custom-fit air inlet opening for a particular piece of equipment so that exhaust air from the equipment does not flow back into the enclosure after entering the exhaust duct.

In features of this aspect, the exhaust duct may be disposed internally relative to the one or more enclosure panels; the adjustable filler panel assembly may include a first panel and a second panel that are telescopically adjustable relative to one another such that a length of the filler panel assembly is selectively adjustable to fill a portion of the air inlet opening, thereby blocking air from flowing through the opening; the internal exhaust duct may be generally box-like in shape and may include an air outlet opening; the air inlet opening may be generally rectangular in shape; the air inlet opening may include a pair of vertical flanges to which the at least one adjustable filler panel assembly is adjustably mounted; the vertical flanges may each include a linear arrangement of mounting apertures to which the at least one adjustable filler panel assembly is adjustably mounted, each separated from the next by ½ RMU; the vertical flanges may each include a linear arrangement of mounting apertures to which the at least one adjustable filler panel assembly is adjustably mounted, each separated from the next by one RMU; the internal exhaust duct may be disposed between the frame structure of the enclosure and an expansion kit panel of the enclosure; the internal exhaust duct may be disposed inside the frame structure of the enclosure; the internal exhaust duct may route exhaust air to the rear of the enclosure and through the air outlet opening; the first and second panels of each adjustable filler panel assembly may be connected to one another in an overlapping arrangement to form an air-blocking panel assembly with the attachment members of the second panel being aligned with and connected to a pair of adjustment openings of the first panel; the first panel may have a plurality of pairs of horizontally aligned adjustment openings formed therein, and the second panel may have at least one pair of horizontally aligned attachment members disposed near an end of the panel; the second panel may have a single pair of horizontally aligned attachment members disposed near an end of the panel; the plurality of pairs of horizontally aligned adjustment openings in the first panel may be separated vertically by one RMU; the adjustable filler panel assembly may further include a pair of side flanges connected to each of the first and second panels, the side flanges further including at least one pair of elongate slots; the pair of side flanges of the first panel may include more than one pair of elongate slots; the electronic equipment enclosure may further include a flange at one end of each of the first and second panels; the orientation of the first and second panels in relation to one another may be altered in order to facilitate vertical adjustment of the assembly; each adjustable filler panel assembly may be reconfigurable from a close-ended configuration to an open-ended configuration; and the first and second panels may be reconfigurable between the close-ended configuration and the open-ended configuration by rotating one panel 180 degrees relative to the other panel.

The present invention according to still another aspect is an electronic equipment enclosure that includes a frame structure; one or more enclosure panels mounted on the frame structure, the frame structure and the one or more enclosure panels together defining an enclosure; an exhaust duct, disposed internally relative to the one or more enclosure panels, that has an air inlet opening formed therein for receipt of exhaust air from equipment mounted in the enclosure; and a plurality of adjustable filler panel assemblies for selectively blocking portions of the air inlet opening in order to create a custom-fit air inlet opening for a particular piece of equipment so that exhaust air from the equipment does not flow back into the enclosure after entering the exhaust duct.

In features of this aspect, the internal exhaust duct is substantially the same height as the enclosure, and the plurality of adjustable filler panel assemblies may be of different sizes.

The present invention according to still yet another aspect is a method of customizing air flow in an electronic equipment enclosure that includes providing a frame structure having one or more enclosure panels mounted thereon, the one or more enclosure panels together defining an enclosure; installing an exhaust duct in the enclosure, the exhaust duct having an air inlet opening formed therein for receipt of exhaust air from equipment mounted in the enclosure; and installing a plurality of adjustable filler panel assemblies in the enclosure to selectively block portions of the air inlet opening.

In features of this aspect, the step of installing a plurality of adjustable filler panel assemblies may include installing the adjustable filler panel assemblies in the vicinity of an exhaust grille on a side of a piece of electronic equipment mounted in the electronic equipment enclosure without blocking the exhaust grille, thereby creating a custom-fit air inlet opening for a particular piece of equipment so that exhaust air from the equipment does not flow back into the enclosure after entering the exhaust duct.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
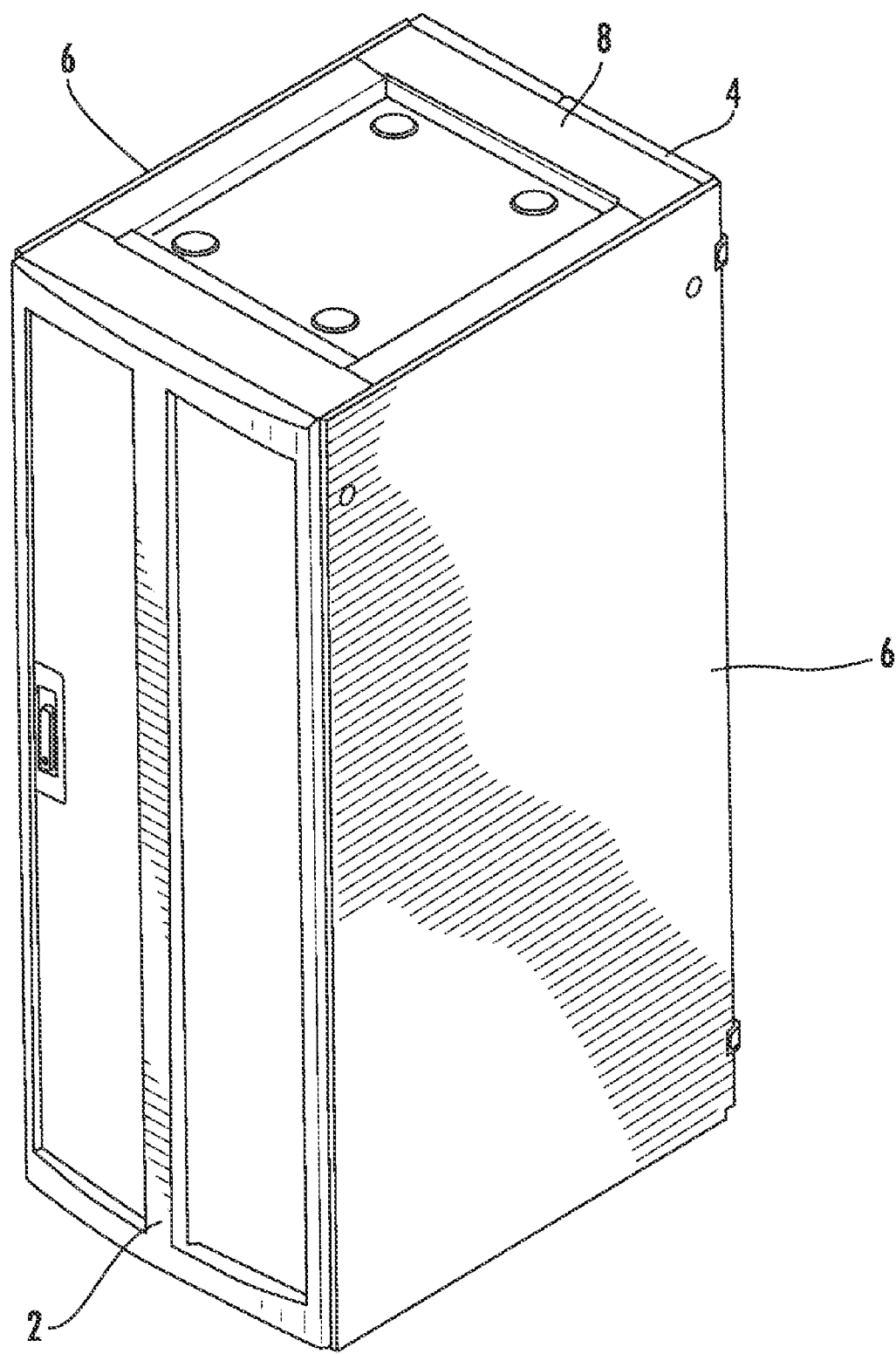
FIG. 1 is a front orthogonal view of an electronic equipment enclosure having an internal exhaust duct and a plurality of adjustable filler panel assemblies installed therein, all in accordance with an embodiment of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is it to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Figure 2:
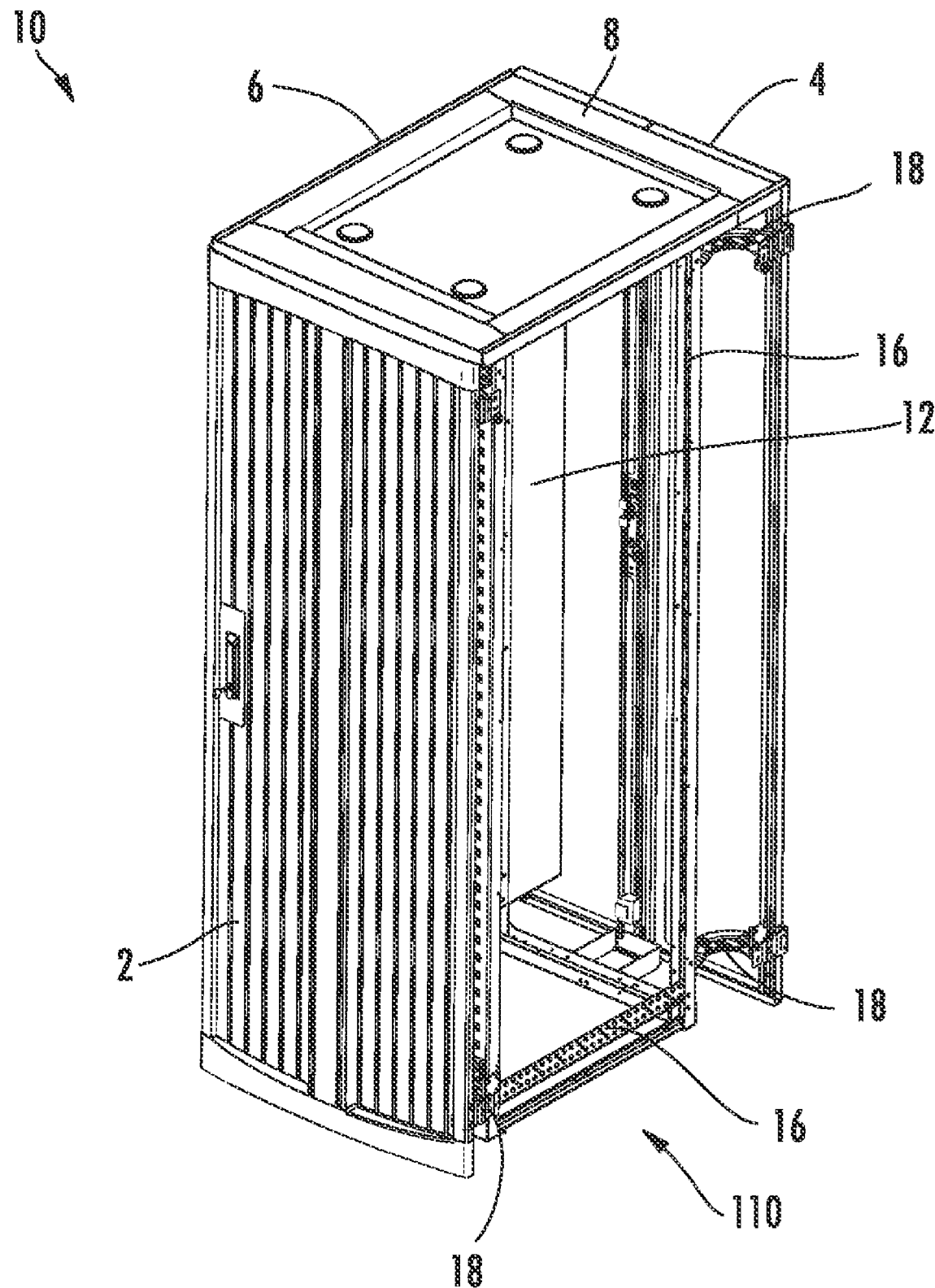
FIG. 2 is a front orthogonal view of the electronic equipment enclosure of FIG. 1, shown with the adjustable filler panel assemblies removed.

FIG. 1 is a front orthogonal view of an electronic equipment enclosure 10 having an internal plenum or exhaust duct 12 and a plurality of adjustable filler panel assemblies 14 installed therein, all in accordance with an embodiment of the present invention, and FIG. 2 is a front orthogonal view of the electronic equipment enclosure 10 of FIG. 1, shown with the right side panel 6 removed. As shown therein, the enclosure 10 includes an interior four post frame structure 16 and an enclosure expansion kit, which may include a plurality of offset brackets 18, one or more center support brackets 19, an oversized front door 2, an oversized back panel 4, a pair of oversized side panels 6 and a top panel extension panel 8. An example of a complete enclosure expansion kit is shown and described in commonly-assigned U.S. patent application Ser. No. 11/837,537, published as U.S. Ser. No. 08/003,5810 and entitled "OFFSET BRACKETS FOR EXPANDING ELECTRONIC EQUIPMENT CABINETS," the entirety of each of which is incorporated herein by reference. In the embodiment shown in U.S. patent application Ser. No. 11/837,537, the back panel includes a pair of hinged doors, but it will be appreciated that a single door, a single (non-door) panel, or the like may be substituted for the pair of hinged doors shown in such application, and further that each door or panel may be solid (non-perforated) or may include perforations or some other means of releasing exhaust air from the enclosure 10. In this regard, it is apparent that various replacement components may be substituted for the components of the expansion kit, without departing from the scope of the invention, so long as the general approach of expanding the interior volume of a four post frame structure 16 with some sort of brackets is utilized. Alternatively, the enclosure may be a traditional enclosure (not shown) in which the various panels, including front and/or rear doors panels, are disposed directly adjacent the frame structure instead of being supported by offset support brackets 18.

Although some of the brackets shown in U.S. patent application Ser. No. 11/837,537 are not the same as those shown in the present invention, it will be appreciated that any such bracket may be utilized without departing from the scope of the present invention. Furthermore, the concept of an expanded equipment enclosure is aptly shown therein and the Ordinary Artisan will understand how an expansion kit with the brackets 18 shown herein would work. In summary, eight offset brackets 18 are attached to the four post frame structure 16 for mounting of panels associated with the expansion kit. In the present invention, the brackets 18 are designed so as not to intrude into the spaces created in the sides of the enclosure 10 between the four post frame structure 16 and the panels of the expansion kit. As will be described more fully below, the spaces in the sides of the enclosure 10 between the four post frame structure 16 and the side panels of the expansion kit may be filled by internal exhaust ducts 12, an example of which is shown on the left side of the enclosure 10 in FIGS. 3A-3F.

FIGS. 3A-3F are various views of the electronic equipment enclosure 10 of FIG. 1, shown with the doors and panels removed, illustrating the plurality of adjustable filler panel assemblies 14 installed therein. The interior four post frame structure 16 may be of conventional design and construction, such as that shown in U.S. patent application Ser. No. 11/837, 537, and in fact the present invention is perhaps most applicable to, and useful with, conventional four post frame structures. As shown and described, the four post frame structure 16 includes four vertical members 20, upper and lower front cross members 22,23 upper and lower rear cross members 24,25, a pair of upper side cross members 26 and a pair of lower side cross members 28. A plurality of cross member attachment apertures are arranged at each end of each vertical member 20. Two of the vertical members 20 are connected together at their upper and lower ends by the upper and lower front cross members 22,23, respectively, and the other two vertical members 20 are connected together at their upper and lower ends by the upper and lower rear cross members 24,25, respectively. The front cross members 22,23 and their respective vertical members 20 thus define a front frame 30, and the rear cross members 24,25 and their respective vertical members 20 define a rear frame 32. The front and rear frames 30,32 may then be connected together at their respective corners by the upper and lower side cross members 26,28.

Any known connection means may be used to join the various members together. Although not illustrated herein, at least one example of conventional connection means is described in commonly-assigned U.S. Pat. No. 6,185,098, entitled "CO-LOCATION SERVER CABINET," the entirety of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

A four post frame structure 16 may further comprise horizontal mounting rails with each horizontal mounting rail including two rows of mounting apertures extending along its entire length. Optionally, vertical mounting rails (not shown) may be mounted to the horizontal mounting rails. Each vertical mounting rail preferably includes a series of evenly-spaced, threaded mounting apertures, extending along substantially its entire length, for use in mounting electronic components and equipment, peripheral devices, cable brackets, additional mounting members, or the like thereto.

The internal exhaust duct 12 is disposed between a side of the four post frame structure 16 and a side panel 6 of the expansion kit. The internal exhaust duct 12 may be positioned on either the left or right side of the enclosure 10, depending on the side of the enclosure 10 through which it is desired for exhaust air to be removed. Based on the placement of the internal exhaust duct 12, one of ordinary skill in the art will understand that the internal exhaust duct 12 and adjustable panel assemblies 14 as described herein are perhaps most useful when used in conjunction with equipment through which air flows in a side to side direction, i.e., cool air intake on one side and exhaust air release on the other side, rather than equipment through which air flows in a front to back direction. However, it will be appreciated that similar adjustable panel assemblies may likewise be utilized with air ducts that are located in the front or rear of an enclosure as well without departing from the scope of the present invention. As shown in FIGS. 3A-3F, the duct 12 extends along the full height of the enclosure 10. However, in at least some embodiments, the duct 12 may extend only a portion of the height of the enclosure 10.

As is shown, a rear portion of the exhaust duct 12, having a rear opening 34 extends beyond the rear frame 32 of the four post frame structure 16. The rear opening 34 in the rear portion enables exhaust air to flow therethrough. Although not shown, the rear portion may abut the back panel 4 of the enclosure expansion kit; thus, exhaust air may flow through the rear opening 34 of the exhaust duct 12 and out through or past the back panel 4 of the enclosure 10. In at least some embodiments, exhaust air may flow through the rear opening 34 and out through perforations (not shown) in the back panel 4. Additionally, the rear opening 34 of the exhaust duct 12 may be located at any point along the height of the duct 12 or the rear opening 34 may open at the top or bottom of the duct 12.

The exhaust duct 12 also includes a generally rectangular shaped inlet opening 36 (perhaps most fully appreciated in FIG. 4B) into the interior 38 of the enclosure 10 that is preferably located near the front frame 30 of the enclosure 10 and extends substantially the entire height thereof. However, in at least some embodiments, the inlet opening 36 is located near the rear frame 32, while in at least some other embodiments, the inlet opening 36 is centered between the front frame 30 and the rear frame 32. Also, in at least some embodiments, the inlet opening 36 extends only a portion of the height of the enclosure 10. As will be explained more fully below, exhaust air from equipment stored in the enclosure 10 is routed into the inlet opening 36 of the duct 12 and is then routed out of the enclosure 10 through the rear opening 34 of the duct 12.

Figure 3A:
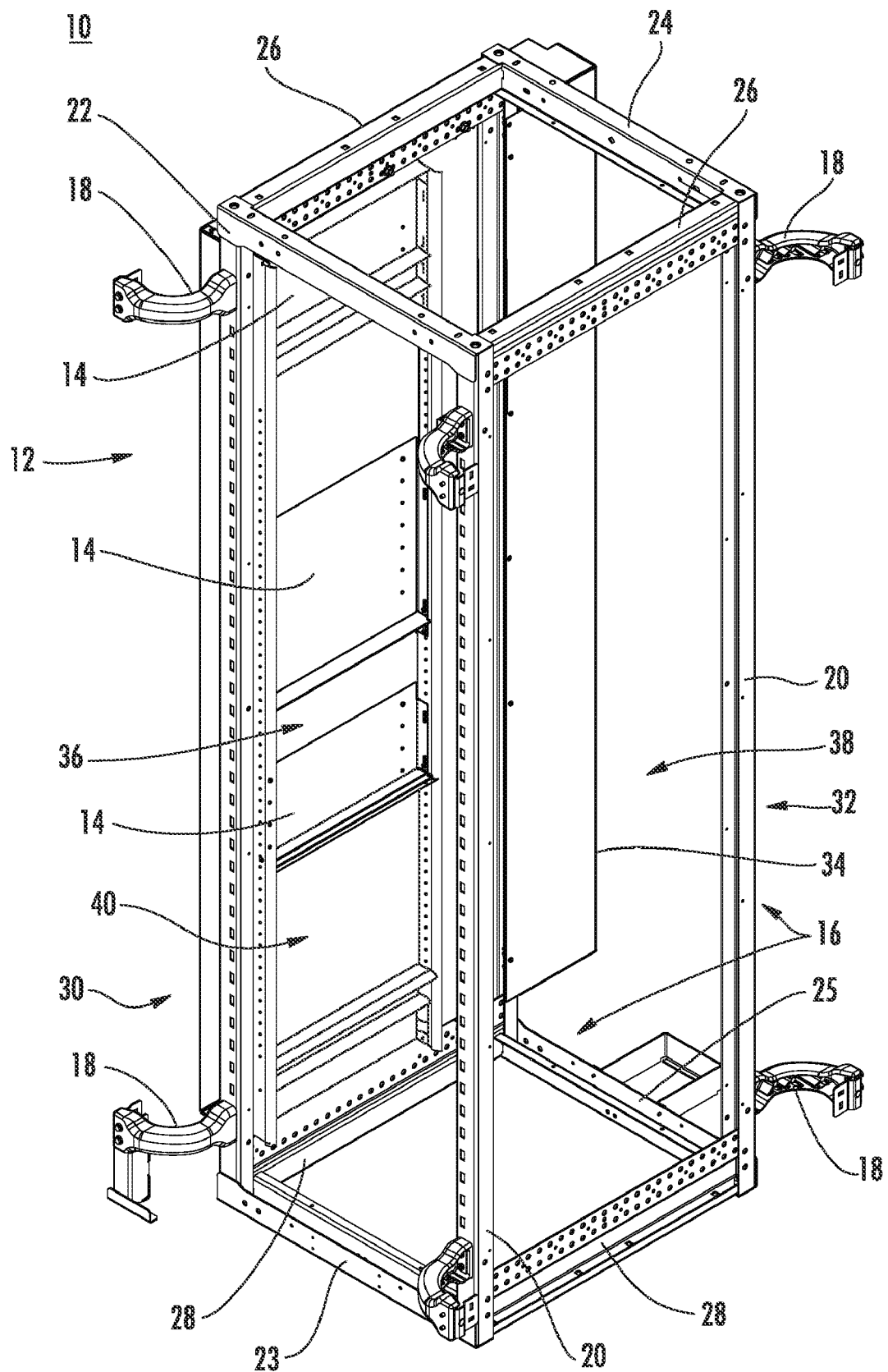
FIG. 3A is a front orthogonal view of the electronic equipment enclosure of FIG. 1, shown with the doors and panels removed, illustrating the plurality of adjustable filler panel assemblies installed therein.
Figure 3B:
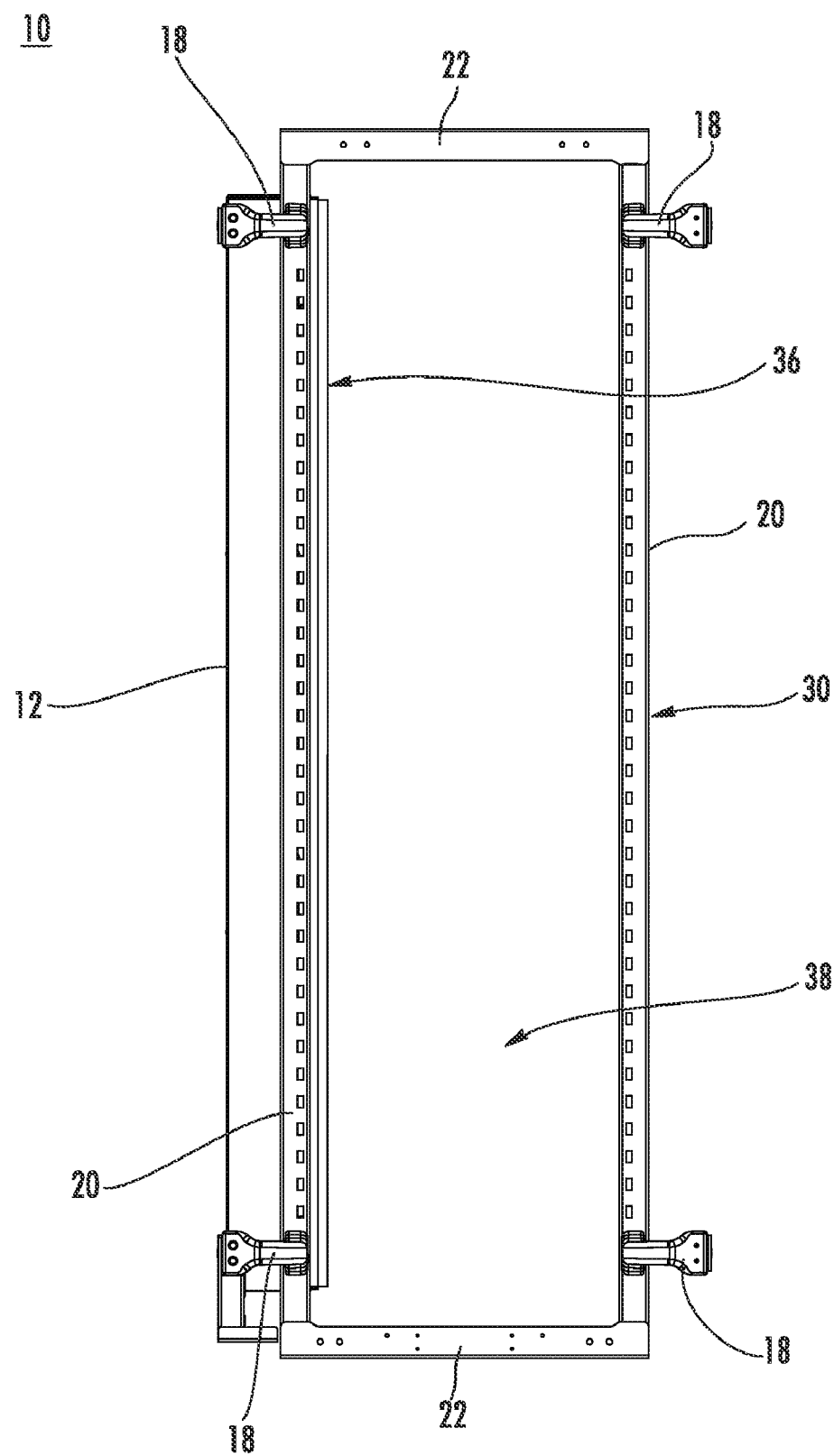
FIG. 3B is a front plan view of the electronic equipment enclosure of FIG. 3A.
Figure 3C:
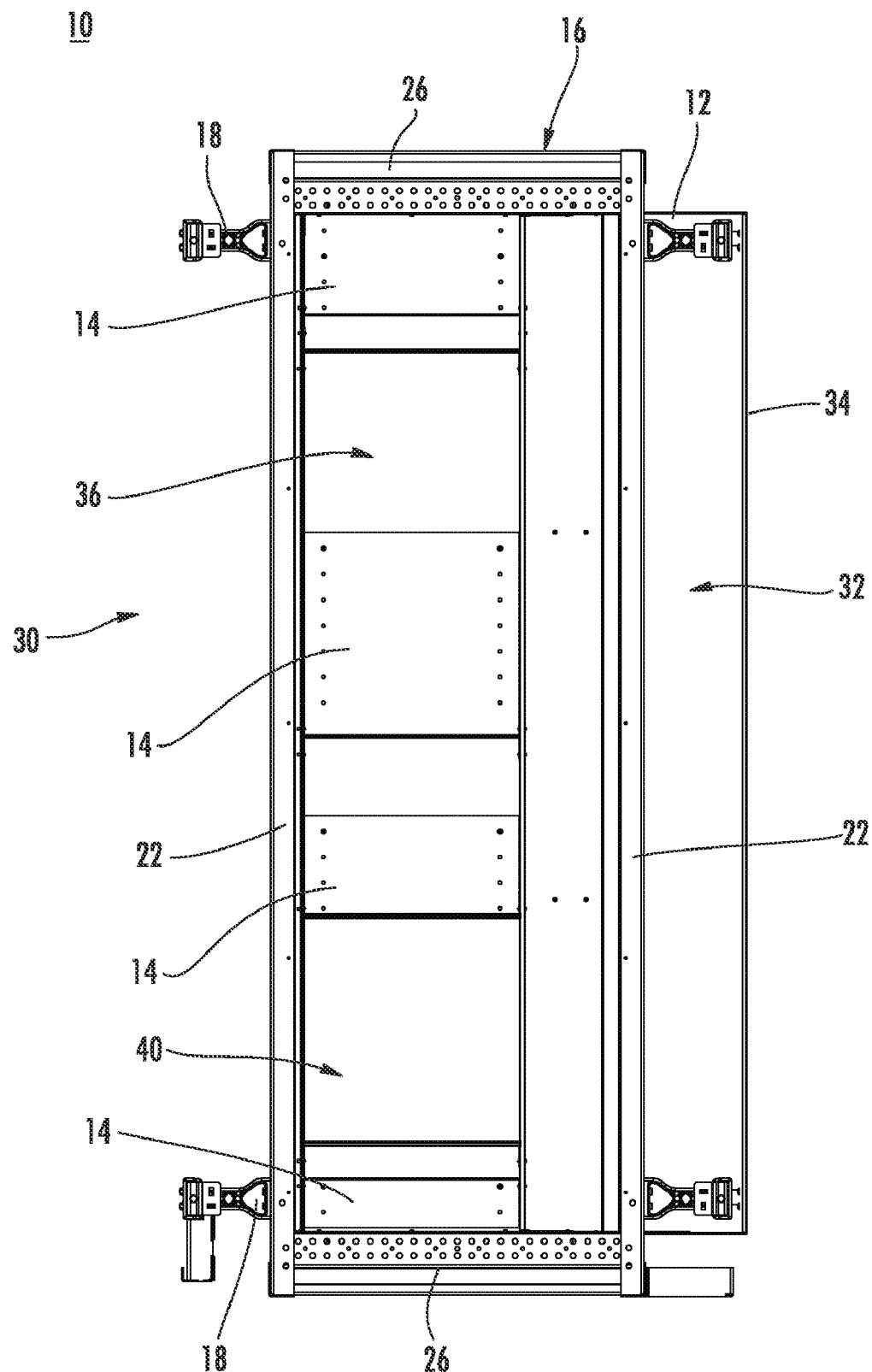
FIG. 3C is a right side plan view of the electronic equipment enclosure of FIG. 3A.
Figure 3D:
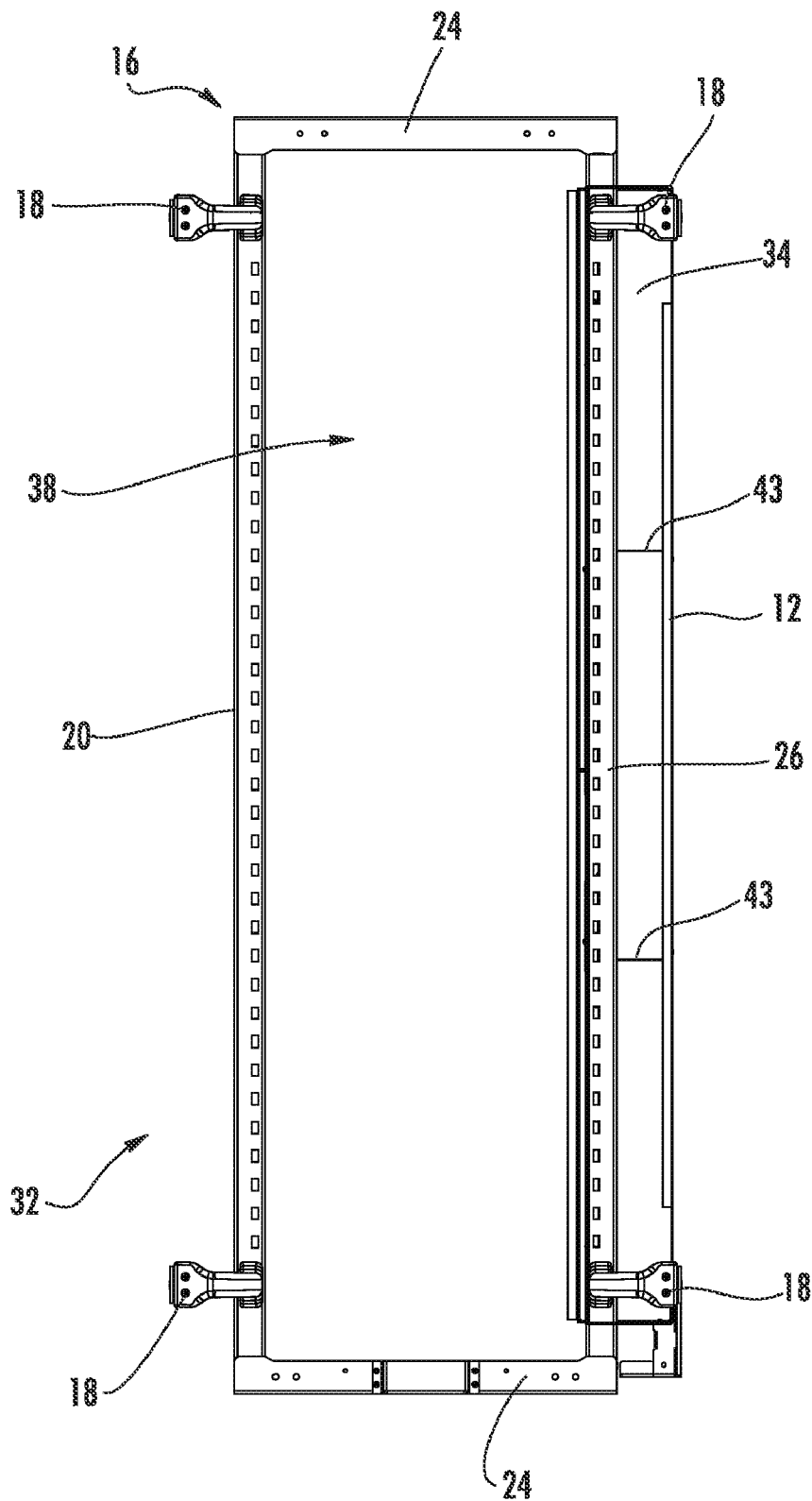
FIG. 3D is a back plan view of the electronic equipment enclosure of FIG. 3A.
Figure 3E:
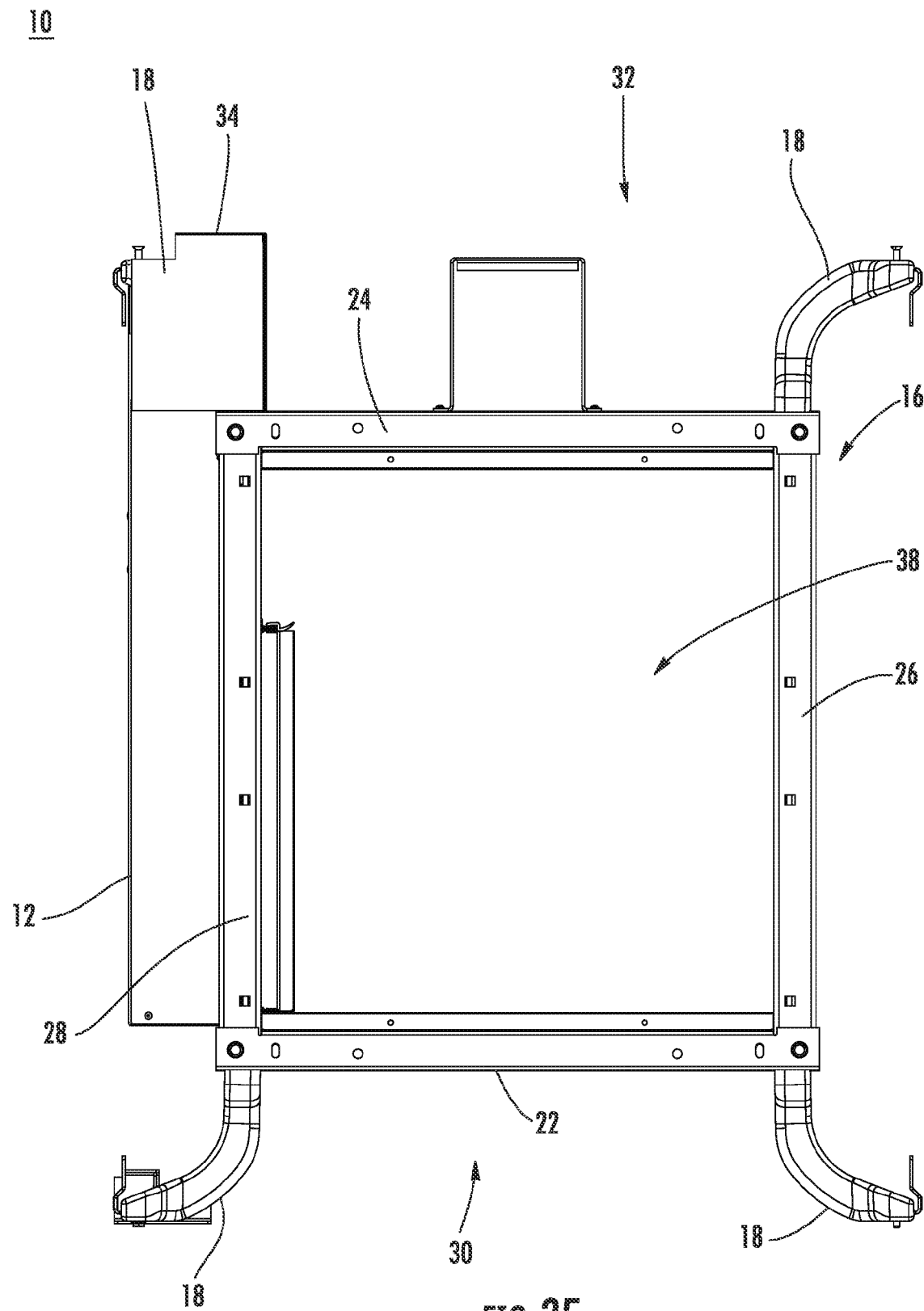
FIG. 3E is a top plan view of the electronic equipment enclosure of FIG. 3A.

As perhaps best shown in FIGS. 3A and 3C, one or more adjustable filler panel assemblies 14 may be disposed as desired in the inlet opening 36 of the internal exhaust duct 12. In the particular arrangement illustrated, four adjustable filler panel assemblies 14 are disposed in the inlet opening 36. It will be appreciated that the four illustrated panel assemblies 14 are merely exemplary of the various combinations of panel assemblies 14 that could be used in the inlet opening 36 of the exhaust duct 12. The filler panel assemblies 14 selectively close off portions of the inlet opening 36 of the internal exhaust duct 12 and create a barrier between the exhaust duct 12 and the interior 38 of the enclosure 10 so that air passing from equipment mounted in the enclosure 10 through exhaust openings 40 into the exhaust duct 12 does not return from the exhaust duct 12 back into the interior 38 of the enclosure 10. For example, in the embodiment shown in FIGS. 3A-3F, an exhaust opening 40 is left between the lowermost filler panel assembly 14 and the next higher filler panel assembly 14. This opening 40 is utilized to release air exhausted by equipment stored in the enclosure 10 into the exhaust duct 12. More particularly, the opening 40 that is formed in the exhaust duct inlet 36 may be aligned with the exhaust grilles of one or more particular pieces of equipment so that air exhausted by the equipment is routed into and through the exhaust duct 12 and out the rear of the enclosure 10. Through proper sizing and alignment of one or more filler panel assemblies 14, further described hereinbelow, the exhaust opening 40 may be sized and aligned appropriately to fit the exhaust grille or grilles of the particular piece or pieces of equipment to avoid air exhausted by the equipment escaping into the interior 38 of the enclosure 10 and adding undesirable heat to the enclosure 10. Furthermore, as further described hereinbelow, it is preferred that the inlet opening 36 of the duct 12 and edges of the filler panel assembly 14 that are in contact with active equipment be fitted with a compliant sealing material such as a rubber seal 57, perhaps best shown in FIGS. 8-11, to minimize air leakage into the interior 38 of the enclosure 10.

As described previously, network switches tend to generate a large amount of heat and therefore are often of particular concern when considering thermal management of an enclosure. However, it will be appreciated by the Ordinary Artisan that the present invention is likewise applicable to a wide variety of other types of equipment.

It will further be appreciated that because of the adjustable nature of the filler panel assemblies 14, the placement and sizing of each exhaust opening 40 is also adjustable. Each opening 40 may be made larger or smaller depending, for example, on the size of the exhaust grille or grilles of the particular piece or pieces of equipment, and it may be created higher or lower in the enclosure 10 depending on the placement of the particular piece or pieces of equipment from which air is being exhausted. Additionally, although not shown, multiple exhaust openings 40 may be created for multiple pieces of equipment. In essence, the adjustable filler panel assembly 14 enables the exhaust duct 12 to be custom fit to the particular piece or pieces of equipment.

Figure 4A:
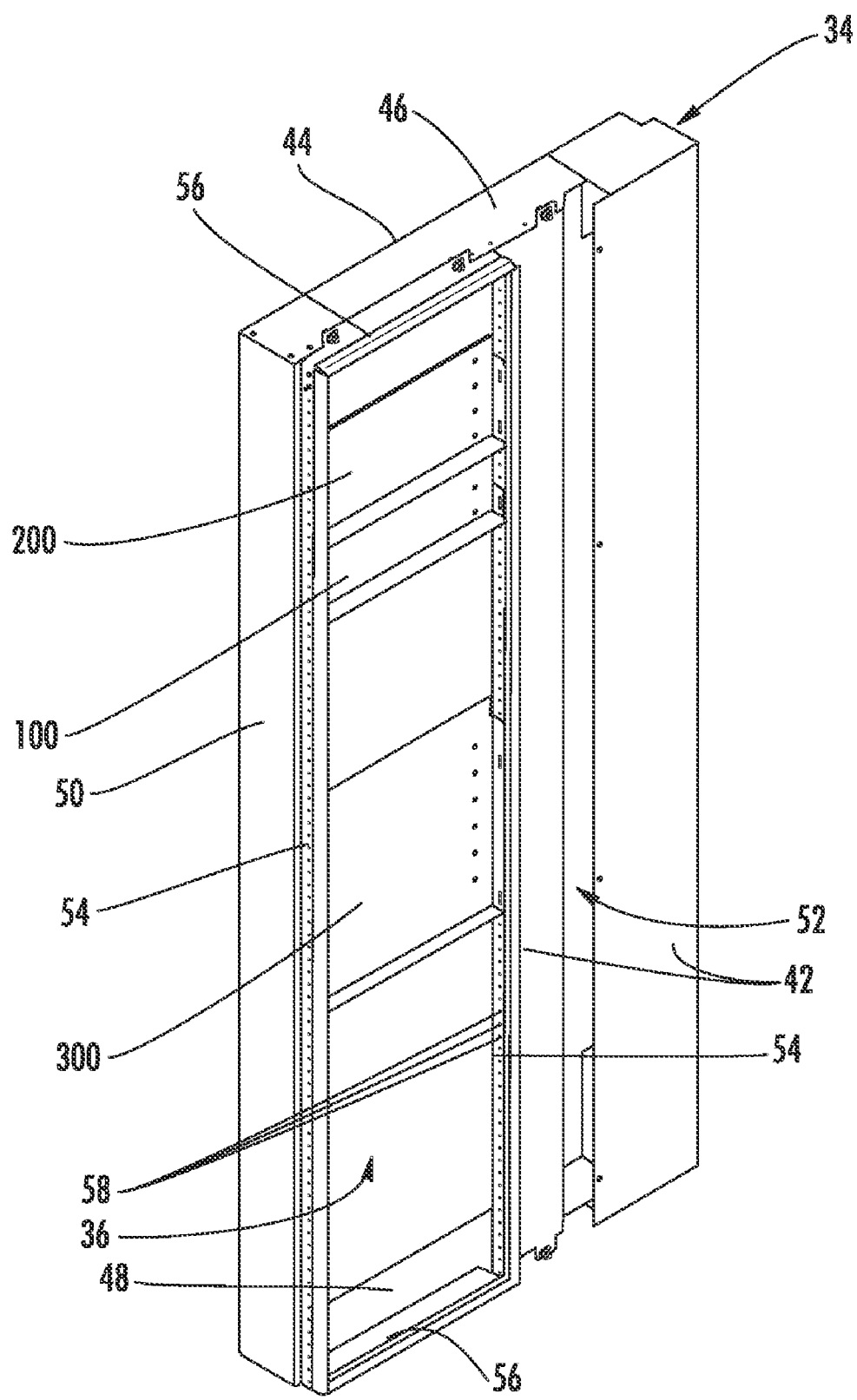
FIG. 4A is a front orthogonal view of the internal exhaust duct of FIG. 3A, shown with the lowermost filler panel assembly removed.
Figure 4B:
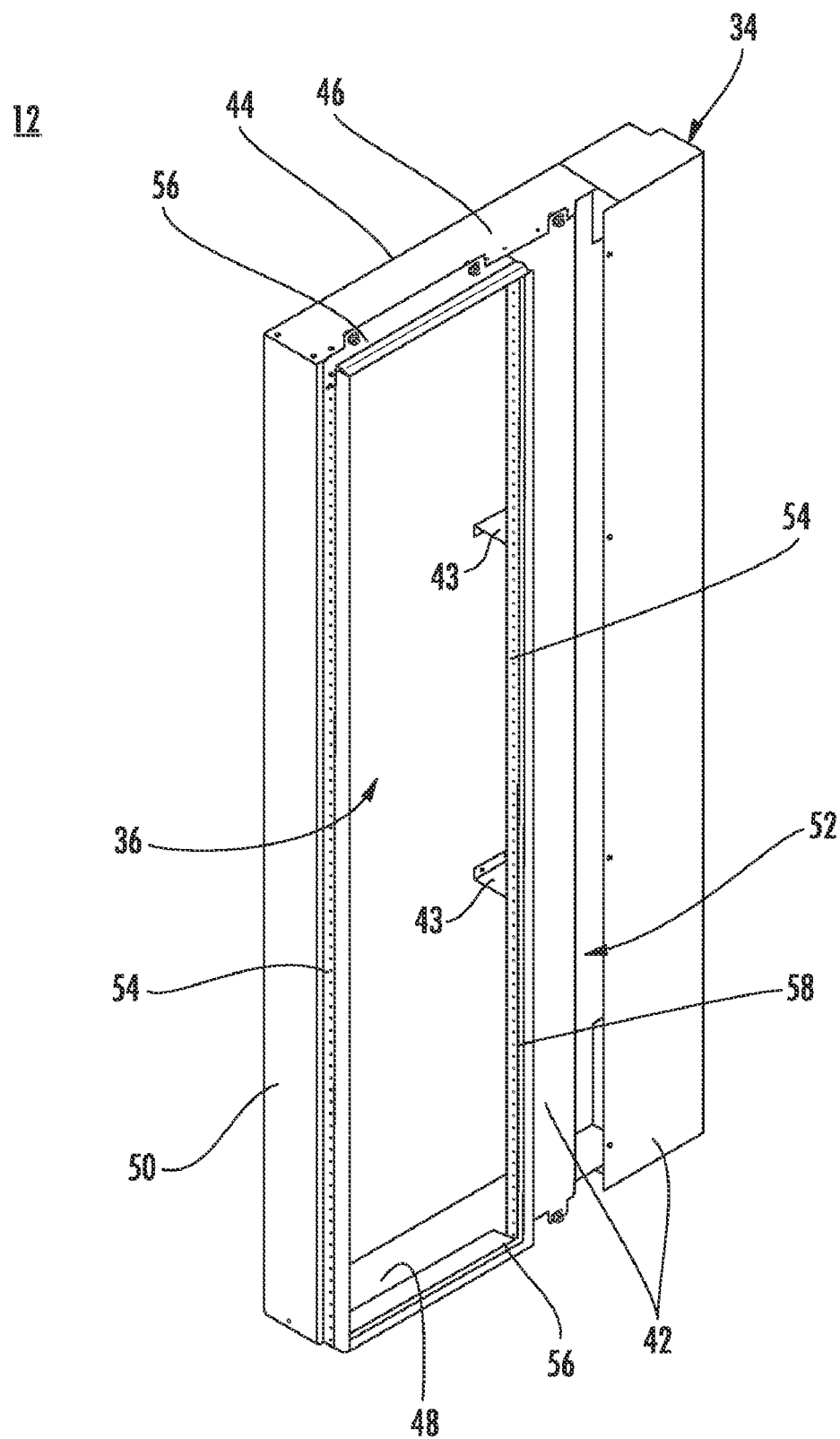
FIG. 4B is a front orthogonal view of the internal exhaust duct of FIG. 4A, shown with all of the adjustable filler panel assemblies removed.
Figure 4C:
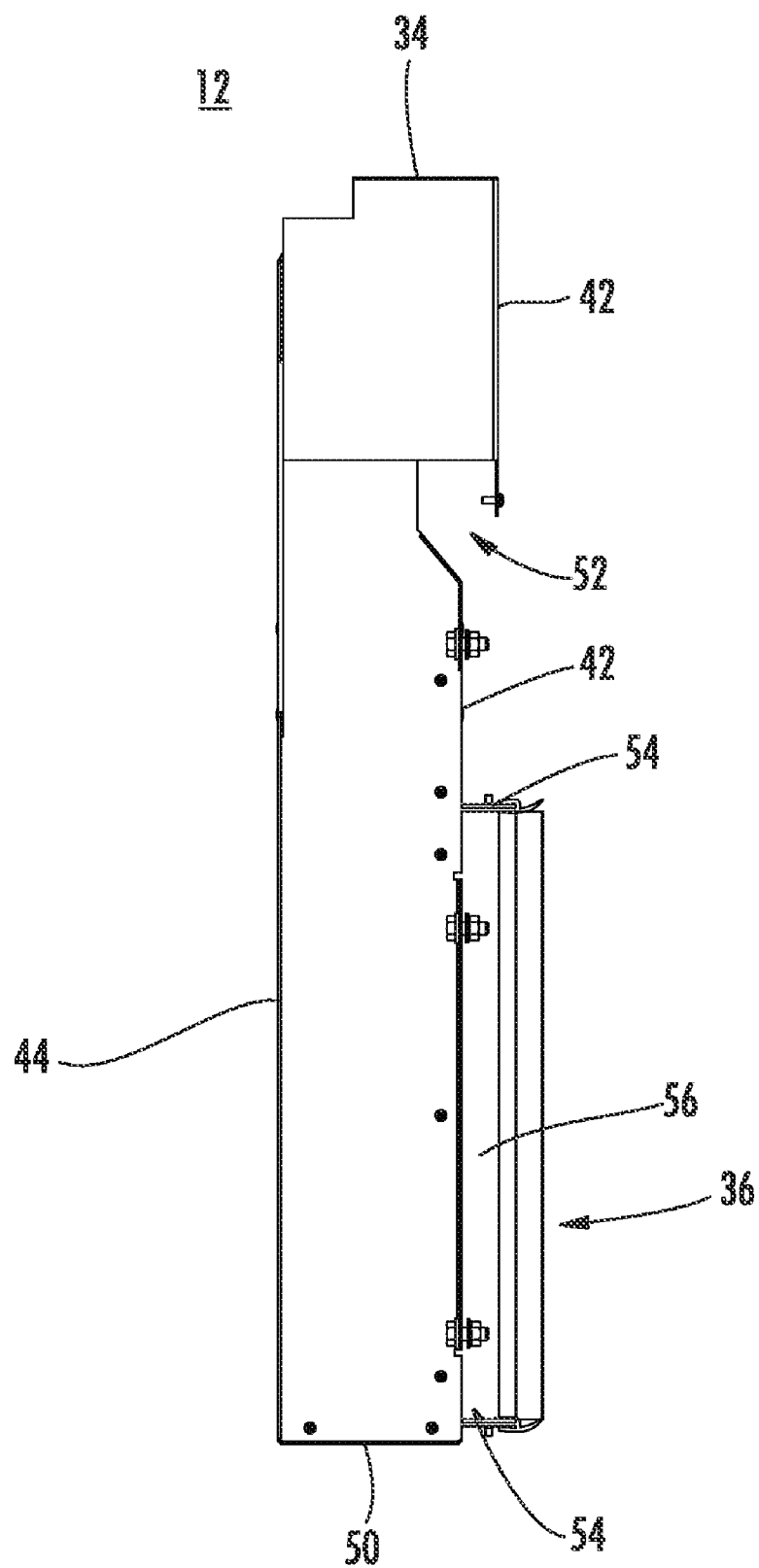
FIG. 4C is a top plan view of the internal exhaust duct of FIG. 4A.

FIGS. 4A-4C are various views of the internal exhaust duct 12 of FIG. 3A, except that the lowermost filler panel assembly has been removed. The exhaust duct 12 is somewhat box-like in shape having opposing inner 42 and outer side walls 44, opposing top and bottom walls 46,48, and a front side wall 50. As explained above, the rear portion opening 34 enables exhausted air to flow therethrough to the rear of the enclosure 10. Each of the walls may include one or more panels. The outer side wall 44 is preferably a continuous or solid panel, however, the inner side wall 42 is bifurcated, with a first portion extending from the inlet opening 36 to the rear vertical member 20 and a second portion, inset from the first portion as perhaps best shown in FIG. 4C, extending from the rear vertical member 20 to the rear of the exhaust duct 12. Together, the first and second wall portions define an additional opening 52 for receipt of a vertical member 20 of the frame structure 16 of the enclosure 10. The inner and outer side walls 42,44 may be held in place relative to each other by one or more spacers 43. When the exhaust duct 12 is installed in an enclosure 10, the front wall 50 is oriented toward the front of the enclosure 10, the outer side wall 44 is oriented toward one of the side panels 6 of the expansion kit, and the inner panel 42 is oriented toward the interior 38 of the enclosure 10 so that the inlet opening 36 may be aligned with the exhaust grille or grilles of equipment mounted in the enclosure 10.

The exhaust duct 12 thus forms a substantially enclosed structure with the exception of the rear portion opening 34, the inlet opening 36 and preferably the frame structure opening 52. However, the frame structure opening 52 is enclosed and sealed by the frame structure 16 when the exhaust duct 12 is installed in the enclosure 10, and much of the inlet opening 36 is closed by the plurality of adjustable filler panel assemblies 14. As such, air that flows into the exhaust duct 12 through the exhaust openings 40 formed in the inlet opening 36 is directed out the rear opening 34 of the exhaust duct 12 to the rear of the enclosure 10 where it is exhausted out of the enclosure 10.

The bifurcation of the inner side wall 42 may assist in the installation of the internal air duct 12 within the enclosure 10. In particular, the portion of the inner side wall 42 nearest the rear of the enclosure 10, together with a portion of the top wall 46 and a portion of the bottom wall 48, may be separable from the remainder of the air duct 12 (with the line of separation visible, for example, in FIG. 4C), thereby permitting the two sections of the air duct 12 to be installed separately. This, in turn, may permit a close fit to be obtained around the rear vertical frame member 20 on the side of the enclosure 10 where the air duct 12 is installed, wherein the rear vertical frame member 20 fits neatly into the opening 52 in the inner side wall 42.

Figure 3F:
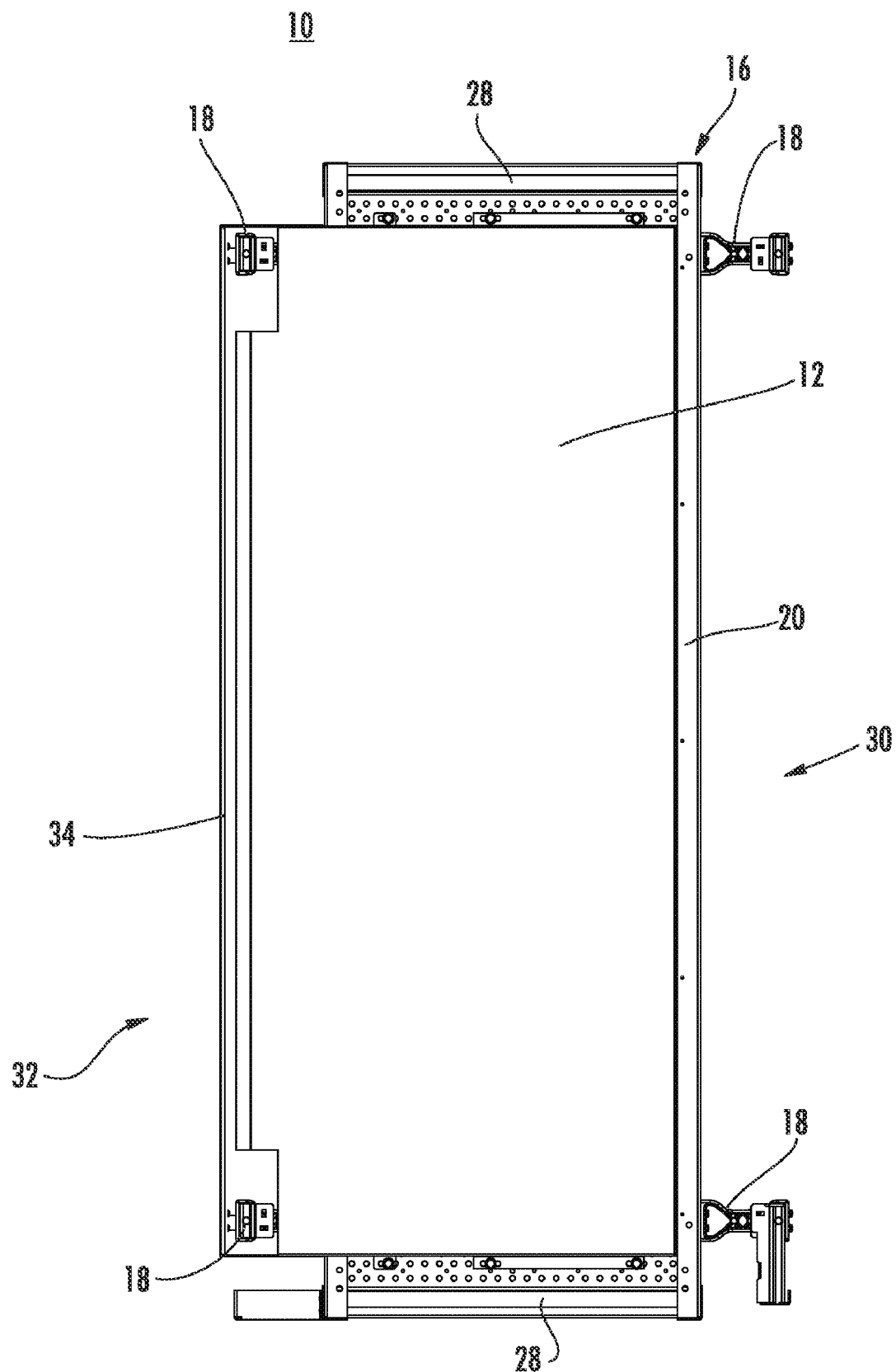
FIG. 3F is a left side plan view of the electronic equipment enclosure of FIG. 3A.

In another unique feature, perhaps best illustrated in FIG. 3F, openings in the rear corners (top and bottom) of the outer side wall 44 permit the offset brackets 18 to pass through the interior of the exhaust duct 12 but to still be used to mount the oversized side panel 6 on that side. The bifurcation of the air duct 12 into a main portion and a rear portion may make it easier to install the air duct 12 within an enclosure 10 without being affected by the offset brackets 18.

As perhaps best seen in FIGS. 4A and 4B, the inlet opening 36 of the duct 12 includes two vertical flanges 54 and two horizontal flanges 56. The vertical flanges 54 have pre-punched holes 58 that allow a panel assembly 14 to be attached thereto. It is preferred that self-tapping screws be used to attach the assembly 14 to the flanges 54; however, it will be understood that any suitable attachment means may be used. It is also preferred that the exhaust duct 12 be constructed of sheet metal, however, it will be understood that other suitable materials may be used to construct the duct 12.

With particular reference to the adjustable filler panel assembly 14, FIGS. 5A, 5B, 6A, 6B, 7A, and 7B show views of various alternative embodiments of the adjustable filler panel assembly 14 in a first or close-ended configuration and a second or open-ended configuration, respectively. Each panel assembly 100,200,300, which will be understood to be a particular implementation of the adjustable filler panel assembly 14 of the present invention, includes respective two overlapping panels 160,162, 260,262 and 360,362. A first panel 160,260,360 includes a plurality of pairs of horizontally aligned adjustment openings 64 and a second panel 162,262, 362 includes a single pair of bolts or other attachment members 66 disposed therethrough for alignment with a particular pair of the adjustment openings 64 of the first panel 160,260, 360. The pair of attachment members 66 of the second panel 162,262,362 are disposed near an open end 68 of the second panel 162,262,362. A user can adjust the size of the filler panel assembly 14, and thus the portion of the inlet opening 36 of the duct 12 the filler panel assembly 14 covers when mounted therein, by telescoping the panel assembly up or down as appropriate and fastening the panels 60,62 together with clamping screws. It will be understood that any appropriate connection means may be used to connect the panels to one another.

As shown in the figures, different sized filler panel assembly embodiments may be made available and used together to cover different portions of the same inlet opening 36. Of course, the filler panel assembly 14 may be made available in any size, but in one preferred commercial implementation, three filler panel assembly embodiments are available—a small filler panel assembly 100 (having a height of 2-3 standard rack mounting units, or RMU), a medium filler panel assembly 200 (4-7 RMU), and a large filler panel assembly 300 (7-15 RMU)—to accommodate various opening sizes and provide maximum versatility. Accordingly, the individual panels 160,162, 260,262 and 360,362 of the assembly 14 are available in three sizes which correspond to the sizes of the panel assemblies 100,200,300. Reference numeral 14 will be used when the adjustable filler panel assembly is being described generally, and reference numerals 100, 200, and 300 will be used when a specific adjustable filler panel assembly is being described. In addition, reference numerals for the various sizes of panels are as follows: small panel assembly first panel 160 and second panel 162, medium panel assembly first panel 260 and second panel 262, and large panel assembly first panel 360 and second panel 362.

With regard to the term "standard rack mounting units" or "RMU," it is well known that the vertical dimension of equipment enclosures is frequently measured in standardized units. The most common unit of measurement is the "rack mounting unit" ("RMU"). According to accepted standards, an RMU is defined as 1.75 inches in height. Electrical components as well as accessories, which include horizontal raceways, patch panels, and the like, are also commonly measured in RMUs. For example, a 2 RMU component is one which is 3.50 inches or less in height. Thus, a rack which has 45 RMUs may accommodate components and accessories totaling 45 RMUs. Further, to conserve space, components and accessories are frequently installed only at vertical locations corresponding to a whole number of RMUs in order to avoid interfering with adjacent components and accessories. Further information about the term "standard rack mounting units" or "RMU" is available in U.S. Pat. No. 7,119,282 to Krietzman, et al., the entirety of which is incorporated herein by reference.

Accordingly, in at least some embodiments, the pairs of horizontally aligned adjustment openings 64 in each first panel 160,260,360 are spaced 1 RMU from each other; i.e., each pair of openings 64 is 1 RMU from the pair above and/or below it. Furthermore, in at least some embodiments, the lines of holes or apertures 58 in each vertical flange 54 are spaced ½ RMU apart; i.e., each aperture 58 is ½ RMU from the one above and/or below it. This facilitates the sizing of each assembly 100,200,300 in increments of a whole number of RMUs, and adjustment of each assembly 100,200,300 in the opening 36 in ½-RMU increments. Such adjustability advantageously makes it easier to size and align exhaust openings 40 with equipment on a whole- or half-RMU incremental basis.

In another embodiment (not shown), the plurality of pairs of horizontally aligned adjustment openings 64 in each first panel 160,260,360 are replaced by a pair of vertical slots, thereby permitting continuous length adjustment of the respective assembly 100,200,300. More particularly, the attachment members 66 may be positioned anywhere in the vertical slots, i.e., from the tops of the slots to the bottoms, thereby allowing the assembly 100,200,300 to be adjusted exactly to any desired length, rather than limiting adjustment to one-RMU increments.

Each panel 160,162, 260,262 and 360,362 of each assembly 100,200,300 includes a pair of opposing side flanges 70,71, extending from side edges of the panel 160,162, 260, 262 and 360,362 and disposed on opposite side edges at the closed end 72,73 of the panel 160,162, 260,262 and 360,362, and an end flange 74,75, extending from the closed end 72,73 of the panel 160,162, 260,262 and 360,362 and disposed in abutting relation with the pair of side flanges 70,71. The opposing side flanges 70,71 and end flanges 74,75 provide additional rigidity and support to the respective panels 160, 162, 260,262 and 360,362 of each assembly 100,200,300, which enhances the stability of the enclosure 10. Each side flange 70,71 has therein at least one elongate slot 76,77, aligned with a corresponding slot 76,77 in the opposite side flange 70,71, for connection of the panels 160,162, 260,262 and 360,362 to the vertical flanges 54 of the inlet opening 36 of the exhaust duct 12. Utilizing elongate slots 76,77 rather than round openings enables vertical adjustability and versatility in connecting the panels 160,162, 260,262 and 360,362 to the exhaust duct 12. In addition, the use of a slotted connection enables a user to push neighboring panels flush against one another to form a seal that minimizes leakage. Also, the slotted connections allow for slight manufacturing errors to be compensated for. When a panel assembly 14 is installed in the inlet opening 36, it is preferred that vertical rubber seals 57, further illustrated in FIGS. 8-11, are interposed between the vertical flanges 54 of the inlet opening 36 of the exhaust duct 12 and the side flanges 70,71 of the panel assembly 14. The rubber seals 57 help to minimize air leakages from the exhaust duct back into the interior of the cabinet.

In the first panel 160,260,360 of the panel assembly 100, 200,300, the side flanges 70 extend substantially the entire length of the sides of the panel 60. However, portions 78 of the sides of the panel 160,260,360 are left open, i.e., without side flanges 70. The length of each open side portion 78 corresponds to the location of the pair of adjustment openings 64 closest to the open end 68 of the panel 160,260,360. As such, there are no side flanges 70 aligned with the pair of adjustment openings 64 located closest to the open end 68 of the panel 160,260,360. The side flanges 70 of the first panel 160,260,360 of each assembly 100,200,300 each include one or more elongate slots 76. In particular, the side flanges 70 of the small sized first panel 160 include a single pair of elongate slots 76, while the side flanges 70 of the medium and large sized first panel 260,360 include a plurality of pairs of elongate slots 76. The particular embodiments shown in FIGS. 6A, 6B, 7A and 7B have two pairs of elongate slots 76 formed therein.

In the second panel 162,262,362 of the panel assembly 100,200,300, the side flanges 71 are relatively short. The length of the side flanges 71 of the second panel 162,262,362 are preferably just long enough to accommodate the pair of elongate slots 77 thereof, though in some embodiments the side flanges may be longer.

It is preferred that the filler panels 160,162, 260,262 and 360,362 be constructed of sheet metal, however, it is to be understood that alternative materials may be used. In fact, the filler panels may be made of any suitable solid material or non-porous fabric. For example, a field-sized fabric construct or a retractable roll of fabric could be developed to selectively close the inlet opening 36 of the exhaust duct 12. Alternatively, the exhaust duct 12 could be constructed with multiple knock-out openings with or without retrofit filler panels to seal the knock-out openings that are no longer desired.

Figure 5A:
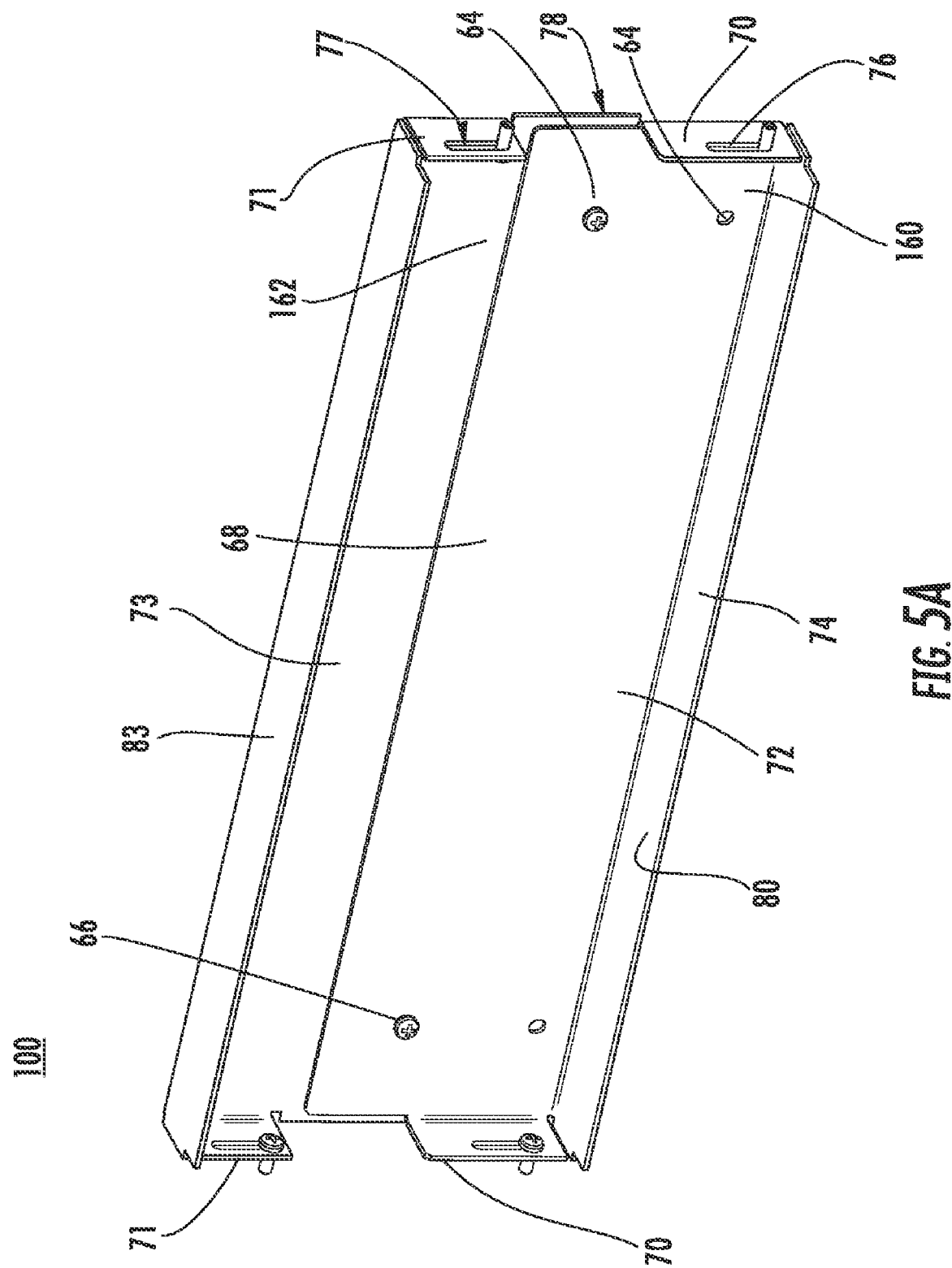
FIG. 5A is a side orthogonal view of an embodiment of one of the adjustable filler panel assemblies of FIG. 3A, shown in a close-ended configuration.
Figure 5B:
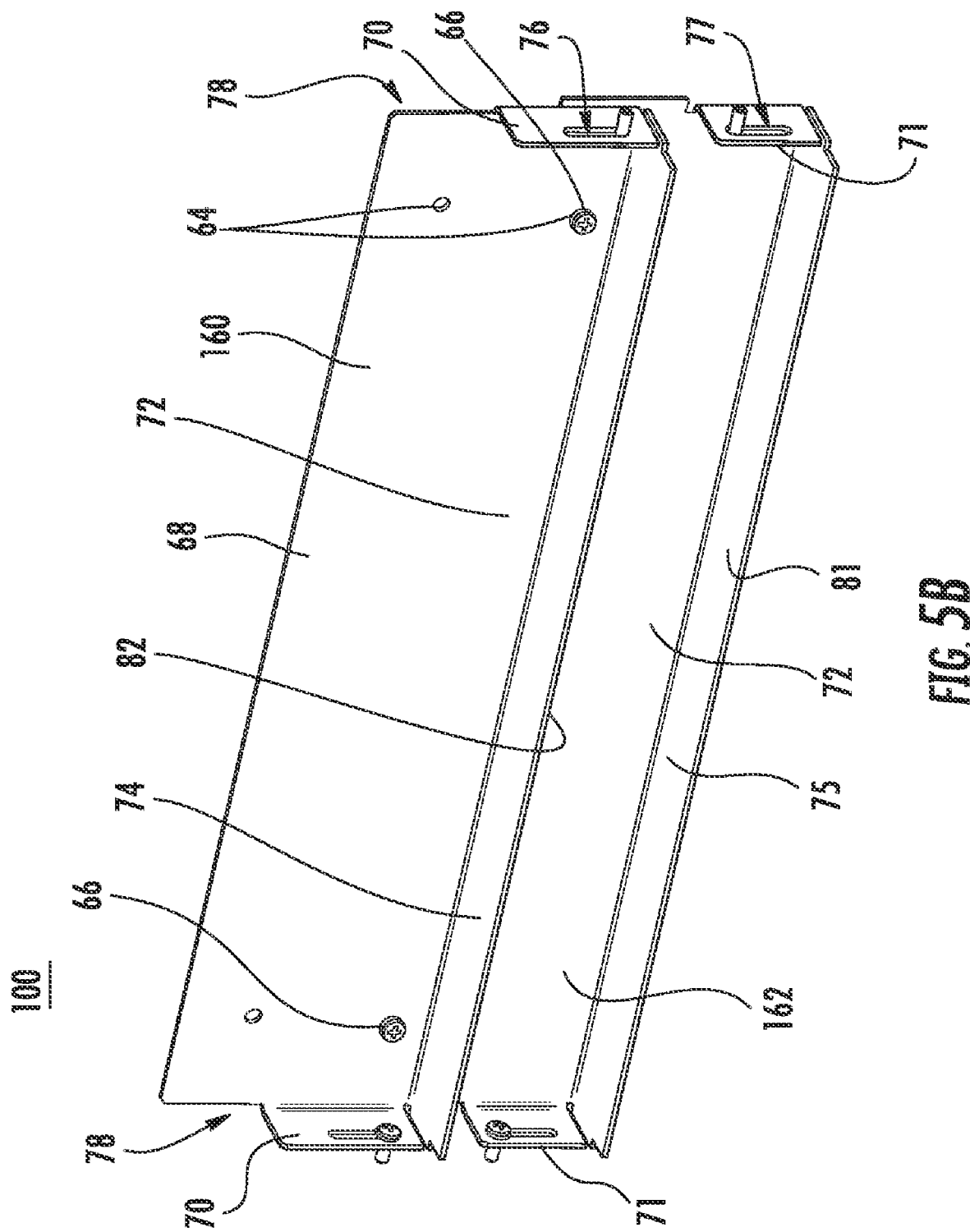
FIG. 5B is a side orthogonal view of the adjustable filler panel assembly of FIG. 5A in an open-ended configuration.
Figure 6A:
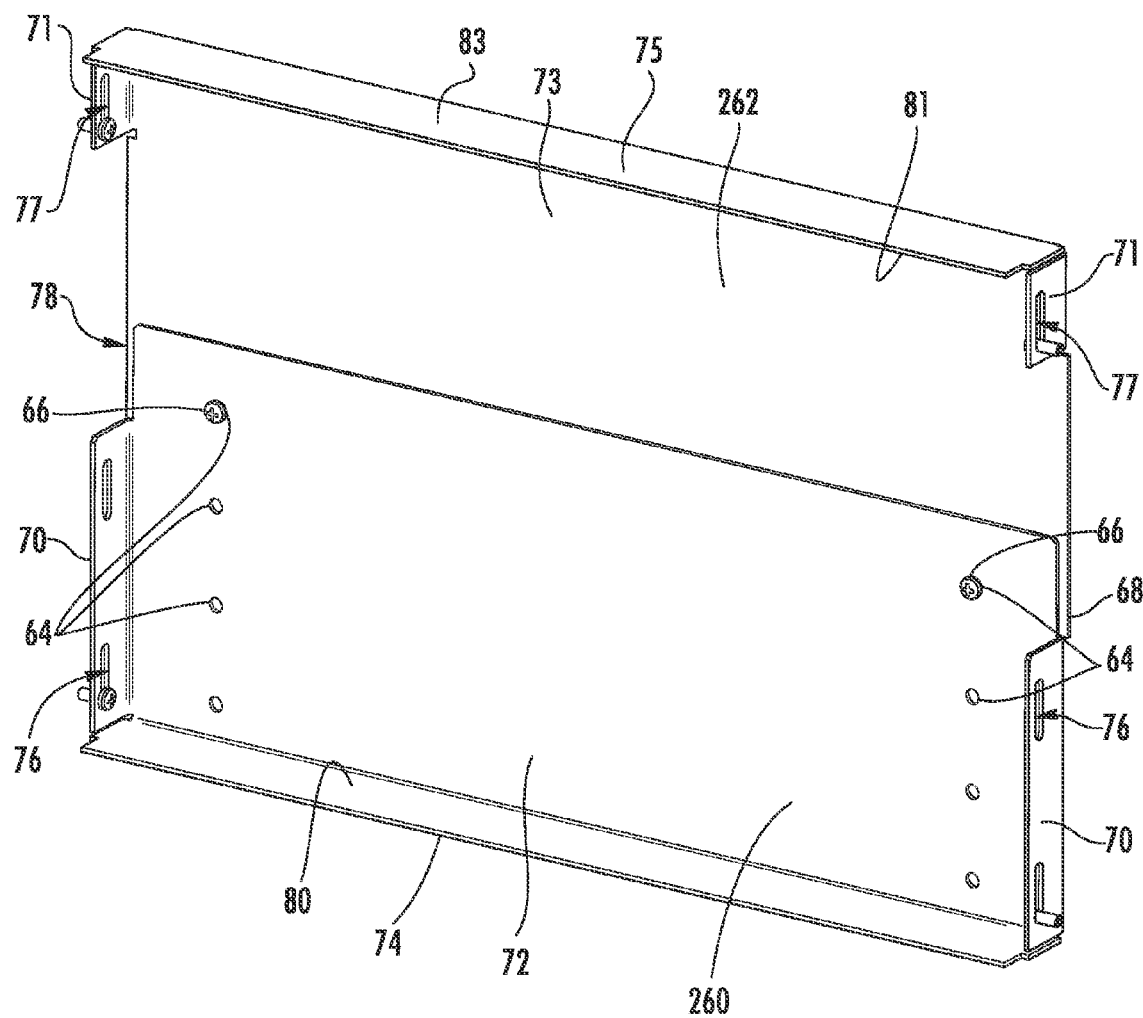
FIG. 6A is a side orthogonal view of an alternative embodiment of another of the adjustable filler panel assemblies of FIG. 3A, shown in a close-ended configuration.
Figure 6B:
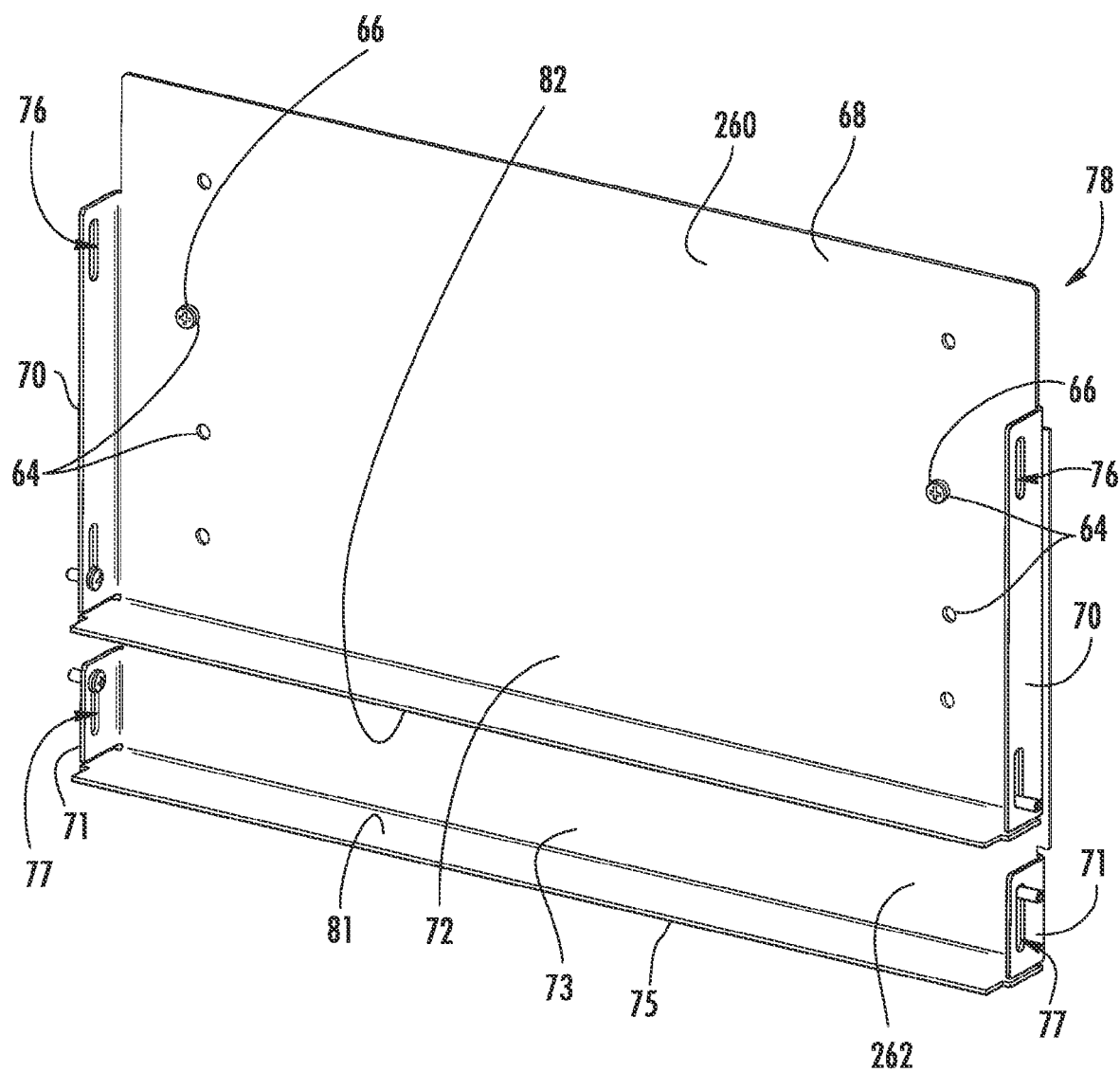
FIG. 6B is a side orthogonal view of the adjustable filler panel assembly of FIG. 6A in an open-ended configuration.
Figure 7A:
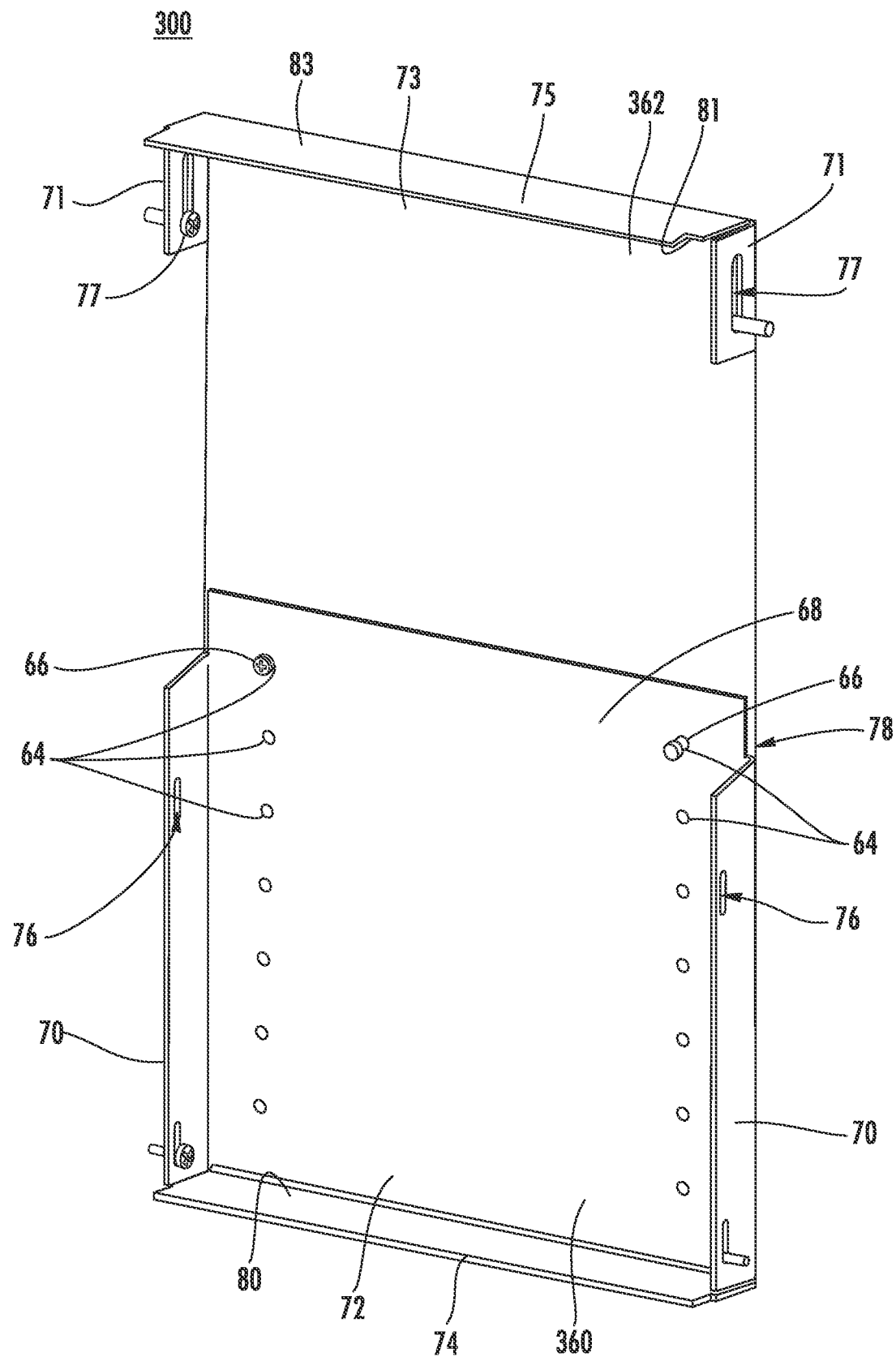
FIG. 7A is a side orthogonal view of another alternative embodiment of still another of the adjustable filler panel assemblies of FIG. 3A, shown in a close-ended configuration.

Each of the illustrated embodiments of the filler panel assembly 14 may be configured in two ways, as shown in FIGS. 5A and 5B, 6A and 6B, and 7A and 7B. FIGS. 5A, 6A and 7A each illustrates a respective filler panel assembly 100,200,300 arranged in a first or close-ended configuration, while FIGS. 5B, 6B and 7B each illustrate a respective filler panel assembly 100,200,300 arranged in a second or open-ended configuration. In the close-ended configuration (FIGS. 5A, 6A, 7A), the pair of adjustment openings 64 closest to the open end 68 of the first panel 160,260,360 is aligned with and connected to the bolts or other attachment members 66 of the second panel 162,262,362. As such, the end flange 74 of each respective first panel 160,260,360 is in opposing facing relation to the end flange 75 in the respective second panel 162, 262,362, and together the flanges 74,75 form outer end boundaries of the respective panel assembly 100,200,300. In this close-ended configuration, the end flanges 74,75 are as far apart from one another as they can be with the panels 160,162, 260,262 and 360,362 of the respective assembly 100,200,300 being connected. It will be appreciated that in this configuration, only a small portion of the panels actually overlap one another. Still further, as shown in FIGS. 5A, 6A, and 7A, the close-ended configuration arranges the end flanges 74,75 of the respective first 160,260,360 and second panels 162,262,362 in a manner such that each is positioned along the periphery of the respective assembly 100,200,300. In this regard, the end flanges 74,75 reinforce the overall rigidity and stability of the filler panel assembly 100,200,300 when installed.

Figure 7B:
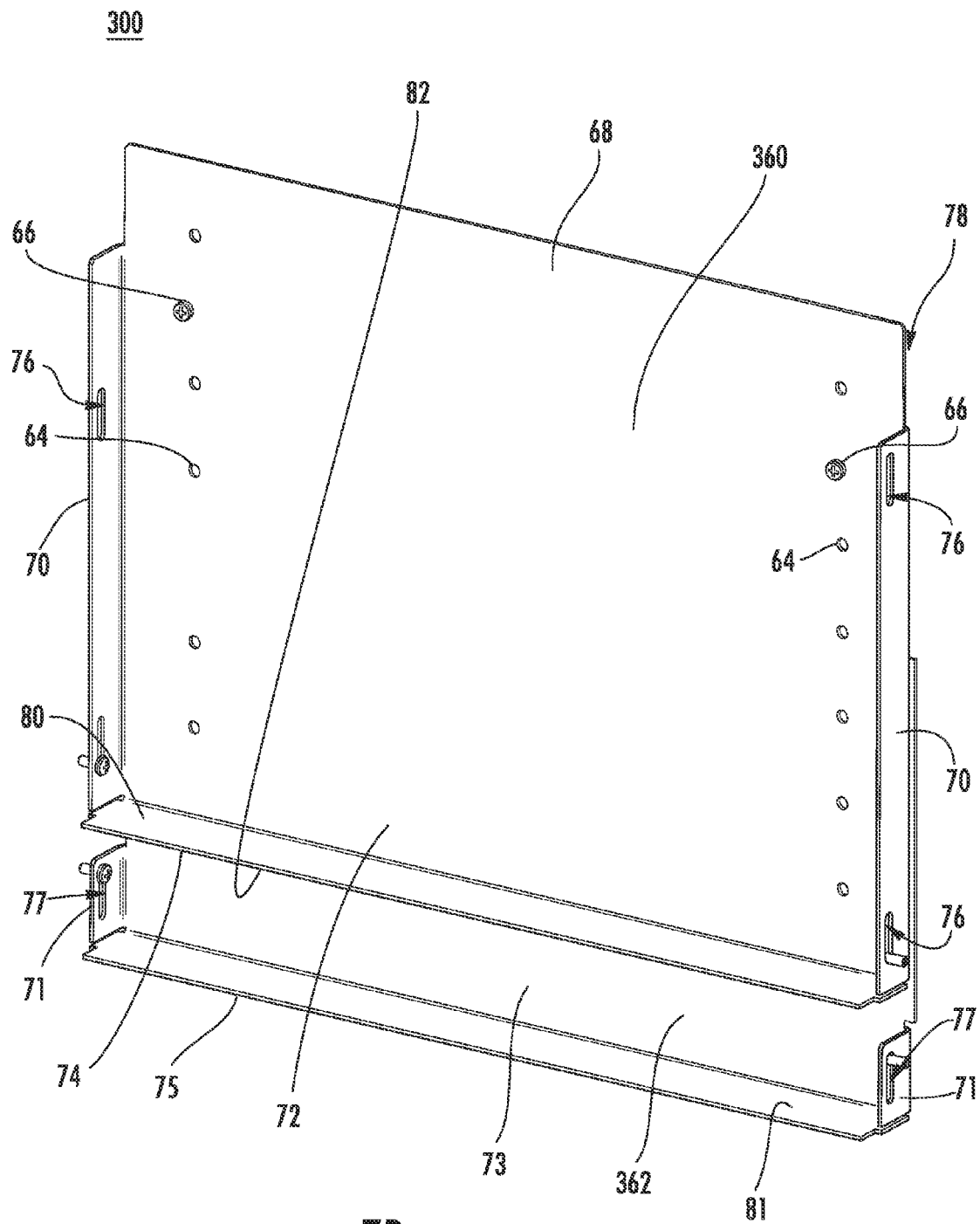
FIG. 7B is a side orthogonal view of the adjustable filler panel assembly of FIG. 7A, shown in an open-ended configuration.

In the open-ended configuration (FIGS. 5B, 6B, 7B), the second panel 162,262,362 is rotated 180 degrees and the first panel 160,260,360 is slid so that it overlaps a substantial portion of the length of the second panel 162,262,362. The pair of bolts or other attachment members 66 of the second panel 162,262,362 are aligned with and connected to the pair of adjustment openings 64 that are second closest to the open end 68 of the first panel 160,260,360. In this configuration, an interior side 81 of the end flange 75 of the second panel 162,262,362 is in opposing relation with an exterior side 82 of the end flange 74 of the first panel 160,260,360. Further, in this configuration, the end flanges 74,75 are as close to one another as they can be with the panels 160,162, 260,262 and 360,362 of the panel assembly 100,200,300 being connected. Furthermore, in the larger sizes of the filler panel assembly 200,300, most of the length of the first and second panels 260,262 and 360,362 are overlapping one another. Still further, as shown in FIGS. 5B, 6B, and 7B, the open end 68 of the panel 160,260,360 extends away from the panel assembly 100,200,300. In this regard, the panel assembly 100,200,300 is permitted to be installed at or near the flanges 56 of the duct 12, as is perhaps best shown in FIG. 9. Advantageously, when the filler panel assembly 100,200,300 is arranged in the open-ended configuration, the exposed open end 68 of the first panel 160,260,360 permits the filler panel assembly 100,200, 300 to be installed without the flanges 56 of the duct 12 otherwise obstructing the installation.

Figure 8:
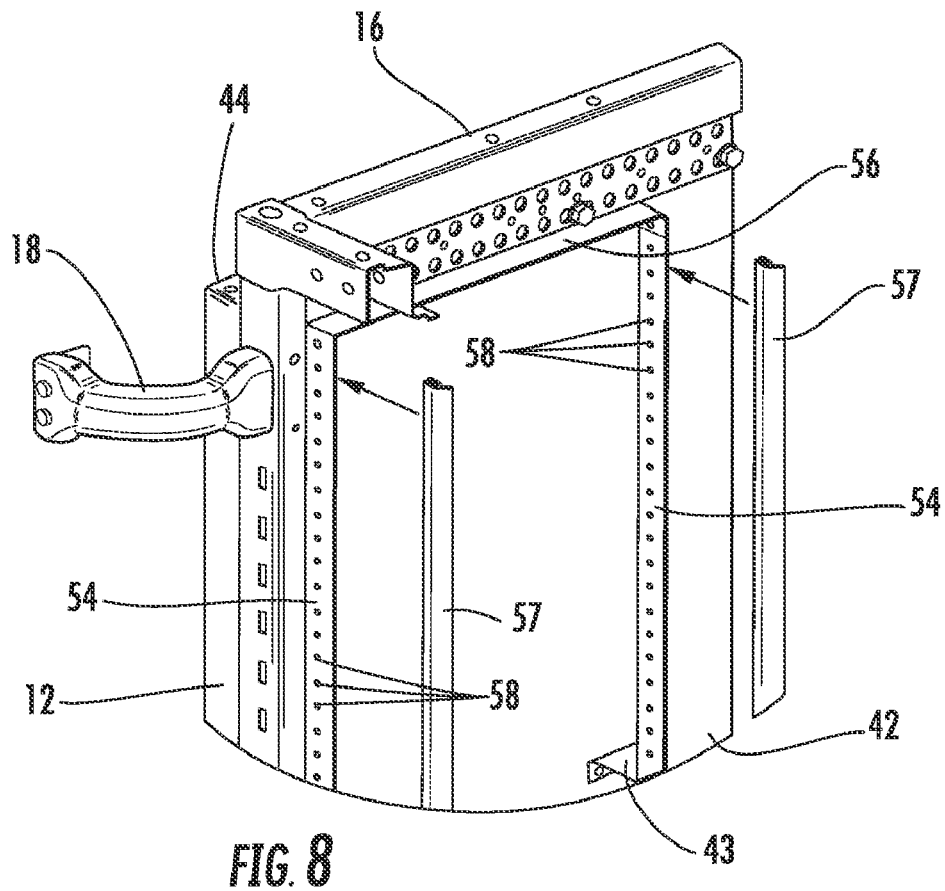
FIG. 8 is a fragmentary, partially exploded orthogonal view of an upper portion of the electronic equipment enclosure of FIG. 3A, illustrating the installation of a pair of vertical rubber seals.

FIG. 8 is a fragmentary, partially exploded orthogonal view of an upper portion of the electronic equipment enclosure 10 of FIG. 3A, illustrating the installation of a pair of vertical rubber seals 57. Preferably, the vertical rubber seals 57 are installed lengthwise along the vertical flanges 54 with the internal duct 12 mounted to the four post frame structure 16 but before the panel assemblies 14 are attached. As noted previously, use of such a sealing material helps minimize air leakage into the interior 38 of the enclosure 10 by making contact with the equipment mounted in the enclosure, thereby closing any gap that might otherwise exist between the equipment and the duct 12. A rubber seal 57 suitable for use in the present invention includes a slot that fits over the edge of the vertical flange 54 and is held in place via friction, but other rubber seals may be substituted therefor.

Figure 9:
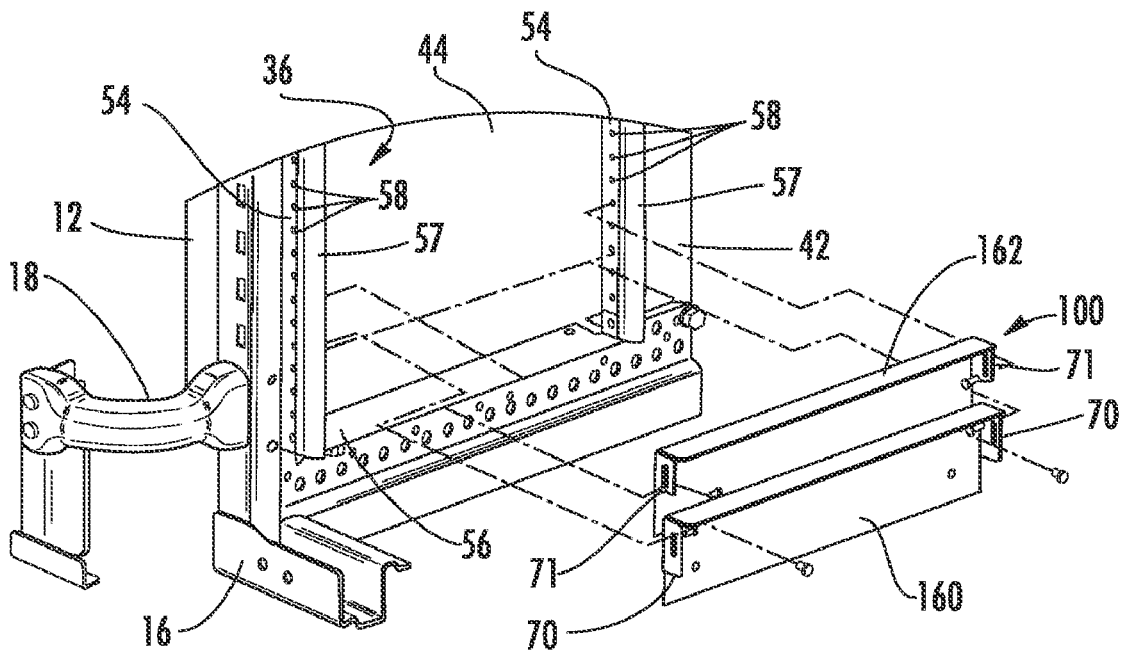
FIG. 9 is a fragmentary, partially exploded orthogonal view of a lower portion of the electronic equipment enclosure of FIG. 3A, illustrating the installation of the lowermost adjustable filler panel assembly.

FIG. 9 is a fragmentary, partially exploded orthogonal view of a lower portion of the electronic equipment enclosure 10 of FIG. 3A, illustrating the installation of the lowermost adjustable filler panel assembly 100. FIG. 9 illustrates the use of the open-ended configuration of one of the panel assemblies 100 when installing the assembly 100 in the uppermost position or the lowermost position in the inlet opening 36 of the exhaust duct 12, thereby avoiding interference between an end flange 74,75 of the assembly 14 and a horizontal flange 56 of the inlet opening 36. As will be appreciated, the open-ended configuration of any of the assemblies 100,200,300 may be particularly suitable for this use. More particularly, the respective assemblies 100,200,300 may be particularly suitable for use in the uppermost position in the inlet opening 36 when oriented as shown in FIGS. 5B, 6B and 7B, while the same assemblies 100,200,300 may be particularly suitable for use in the lowermost position in the inlet opening 36 when turned upside down relative to the orientation shown in FIGS. 5B, 6B and 7B. For example, in FIG. 9, the small filler panel assembly 100 of FIG. 5B is turned upside down and fasteners are inserted through the slots 76,77 in the panels 160,162 and selected apertures 58 in the vertical flanges 54, and the panels 160,162 are attached to one another with fasteners.

Figure 10:
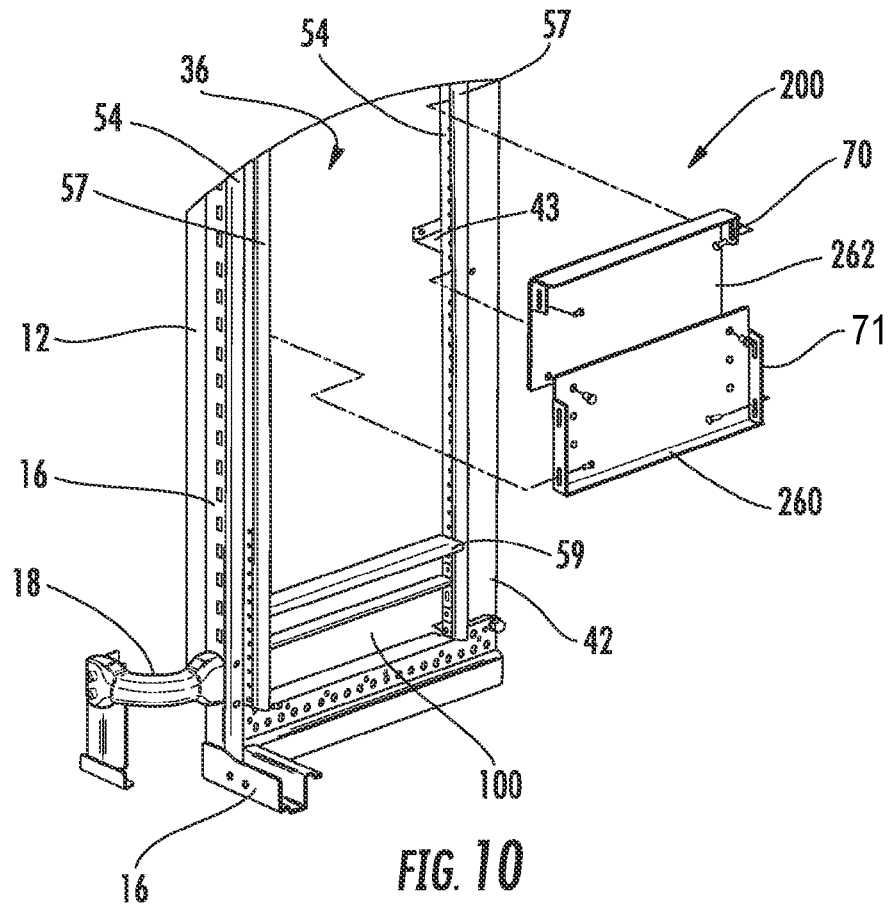
FIG. 10 is a fragmentary, partially exploded orthogonal view of a lower portion of the electronic equipment enclosure of FIG. 3A, illustrating the installation of another adjustable filler panel assembly.

FIG. 10 is a fragmentary, partially exploded orthogonal view of a lower portion of the electronic equipment enclosure 10 of FIG. 3A, illustrating the installation of another adjustable filler panel assembly 200. This panel assembly 200, which is of the size shown in FIGS. 7A and 7B, is installed in its more conventional close-ended configuration, i.e., the configuration of FIG. 7A. As with the panel of FIG. 9, fasteners are inserted through the slots 76,77 in the panels 260,262 and selected apertures 58 in the vertical flanges 54, and the panels 260,262 are attached to one another with fasteners.

Figure 11:
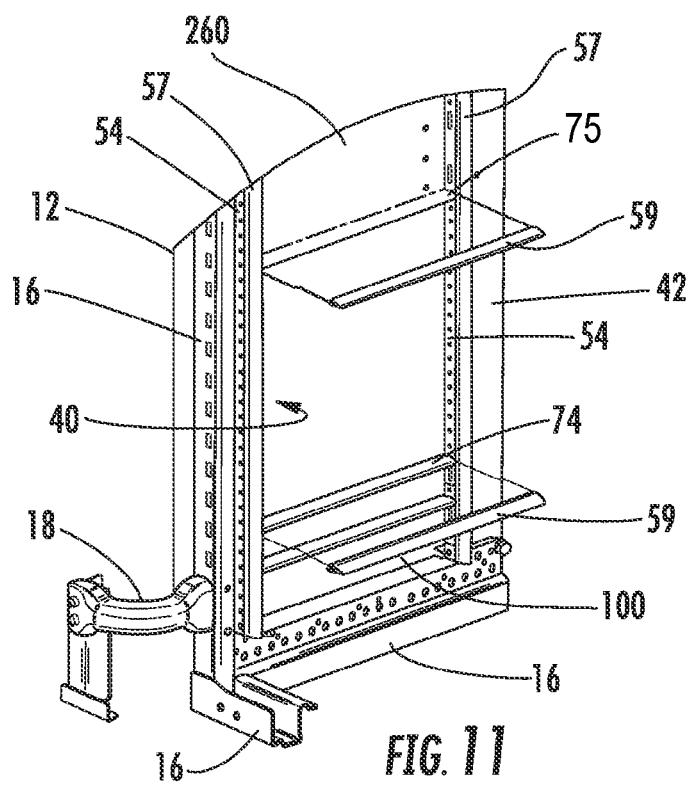
FIG. 11 is a fragmentary, partially exploded orthogonal view of a lower portion of the electronic equipment enclosure of FIG. 3A, illustrating the installation of a pair of horizontal rubber seals.

FIG. 11 is a fragmentary, partially exploded orthogonal view of a lower portion of the electronic equipment enclosure 10 of FIG. 3A, illustrating the installation of a pair of horizontal rubber seals 59. Preferably, the horizontal rubber seals 59 are installed lengthwise as necessary along selected end flanges 74,75 of the assemblies 14 once the panel assemblies 14 are attached. As noted previously, use of such a sealing material helps minimize air leakage into the interior 38 of the enclosure 10 by making contact with the equipment mounted in the enclosure, thereby closing any gap that might otherwise exist between the equipment and the duct 12. A rubber seal 59 suitable for use in the present invention includes a slot that fits over the edge of the end flanges 74,75 and is held in place via friction, but other rubber seals may be substituted therefor. A rubber seal 59 is shown in place on the upper flange 74 of the lower adjustable panel assembly in FIG. 10.

The internal air duct 12 and the filler panel assemblies 14 are used as follows. The air duct 12 is installed in an enclosure such as the enclosure 10 with the extension kit installed thereon that is illustrated in FIGS. 1 and 2. A piece of equipment or a number of pieces of equipment, typically (though not necessarily) with side-located exhaust grilles, are to be mounted inside the four post frame structure 16 of the enclosure 10. The side of the enclosure 10 opposite that of the exhaust grilles may be used to supply cool air to the equipment. Based on the location of the various pieces of equipment, and more particularly, their exhaust grilles, one or more adjustable filler panel assemblies 14 are configured and sized as desired and installed in the exhaust duct inlet 36 in the vicinity of the exhaust grilles to route exhaust air from the equipment into the exhaust duct 12 and to prohibit exhaust air from returning to the interior 38 of the enclosure 10. If the equipment is moved to a different position within the enclosure 10, the adjustable filler assemblies 14 may simply be detached from the exhaust duct inlet 36, adjusted accordingly, and reattached. If any of the equipment is moved or replaced with equipment having a differently sized exhaust grille, the adjustable filler assemblies 14 may be adjusted accordingly by adjusting the size of one or more of the assemblies 14 or by using a differently sized assembly 14 to accommodate the size of the new equipment. Advantageously, the enclosure 10 does not have to be dismantled to replace or move an individual exhaust duct 12 when a new piece of equipment is added or when the existing equipment is moved to a different location in the enclosure 10, as is presently the situation.

Various advantages of the present invention may be appreciated by comparison of the present invention with the conventional solution to the problem of controlled heat exhaust. Prior to the development of the present invention, an individual exhaust duct was utilized for each piece of equipment from which air was being exhausted. The exhaust duct was sized to fit the exhaust grille of the particular piece of equipment. This resulted in exhaust ducts of many different sizes. If a new or different piece of equipment was desired, a new or different exhaust duct also had to be used. In addition to being inefficient from a supply perspective, installing a new or different exhaust duct every time a new or different piece of equipment was placed in the enclosure was inefficient from an operational perspective. With this prior art design, the enclosure had to be at least partially disassembled to remove and replace the exhaust duct that fit the previously used piece of equipment. Even if the piece of equipment was not being removed, but only being moved to a different location within the enclosure, the enclosure had to be at least partially disassembled to also move the associated exhaust duct. Such disassembly was time consuming and increased operational down time. An additional drawback of the conventional system was the size of the exhaust ducts being utilized. The relatively small size of those exhaust ducts created limited cross-sectional area through which exhaust air could flow and thus often resulted in air flow impedance in the exhaust duct. Reduced exhaust air flow can result in increased operating temperatures within the particular piece of equipment, which is detrimental to the equipment. With the present invention, an exhaust duct that extends substantially the entire height of the enclosure may be utilized, thus providing significantly more cross-sectional area through which exhaust air may flow thus reducing potential impedance and reducing operating temperatures of the equipment exhausting air.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. An electronic equipment enclosure comprising:
   (a) a frame structure;
   (b) one or more enclosure panels mounted on the frame structure, the frame structure and the one or more enclosure panels together defining an enclosure;
   (c) an exhaust duct which is substantially the same height as the enclosure and has an air inlet opening formed therein for receipt of exhaust air from equipment mounted in the enclosure; and
   (d) a plurality of adjustable filler panel assemblies for selectively blocking portions of the air inlet opening in order to create a custom-fit air inlet opening for a particular piece of equipment so that exhaust air from the equipment does not flow back into the enclosure after entering the exhaust duct;
   (e) wherein the exhaust duct is disposed internally relative to the one or more enclosure panels; and
   (f) wherein each adjustable filler panel assembly includes a first panel and a second panel that are telescopically adjustable relative to one another such that a length of the filler panel assembly is selectively adjustable to fill a portion of the air inlet opening, thereby blocking air from flowing through the opening.

2. The electronic equipment enclosure of claim 1, wherein the internal exhaust duct is generally box-like in shape and includes an air outlet opening.

3. The electronic equipment enclosure of claim 1, wherein the air inlet opening is generally rectangular in shape.

4. The electronic equipment enclosure of claim 1, wherein the air inlet opening includes a pair of vertical flanges to which the at least one adjustable filler panel assembly is adjustably mounted.

5. The exhaust duct of claim 4, wherein the vertical flanges each include a linear arrangement of mounting apertures to which the at least one adjustable filler panel assembly is adjustably mounted, each separated from the next by ½ RMU.

6. The exhaust duct of claim 4, wherein the vertical flanges each include a linear arrangement of mounting apertures to which the at least one adjustable filler panel assembly is adjustably mounted, each separated from the next by one RMU.

7. The electronic equipment enclosure of claim 1, wherein the internal exhaust duct is disposed between the frame structure of the enclosure and an expansion kit panel of the enclosure.

8. The electronic equipment enclosure of claim 1, wherein the internal exhaust duct is disposed inside the frame structure of the enclosure.

9. The electronic equipment enclosure of claim 1, wherein the internal exhaust duct routes exhaust air to the rear of the enclosure and through the air outlet opening.

10. The electronic equipment enclosure of claim 1, wherein the first and second panels of each adjustable filler panel assembly are connected to one another in an overlapping arrangement to form an air-blocking panel assembly with the attachment members of the second panel being aligned with and connected to a pair of adjustment openings of the first panel.

11. The electronic equipment enclosure of claim 1, wherein the first panel has a plurality of pairs of horizontally aligned adjustment openings formed therein, and the second panel has at least one pair of horizontally aligned attachment members disposed near an end of the panel.

12. The electronic equipment enclosure of claim 11, wherein the second panel has a single pair of horizontally aligned attachment members disposed near an end of the panel.

13. The electronic equipment enclosure of claim 11, wherein the plurality of pairs of horizontally aligned adjustment openings in the first panel are separated vertically by one RMU.

14. The electronic equipment enclosure of claim 1, wherein the adjustable filler panel assembly further includes a pair of side flanges connected to each of the first and second panels, the side flanges further including at least one pair of elongate slots.

15. The electronic equipment enclosure of claim 14, wherein the pair of side flanges of the first panel includes more than one pair of elongate slots.

16. The electronic equipment enclosure of claim 1, further comprising a flange at one end of each of the first and second panels.

17. The electronic equipment enclosure of claim 1, wherein the orientation of the first and second panels in relation to one another may be altered in order to facilitate vertical adjustment of the assembly.

18. The electronic equipment enclosure of claim 1, wherein each adjustable filler panel assembly is reconfigurable from a close-ended configuration to an open-ended configuration.

19. The adjustable filler panel assembly of claim 18, wherein the first and second panels are reconfigurable between the close-ended configuration and the open-ended configuration by rotating one panel 180 degrees relative to the other panel.

20. An electronic equipment enclosure comprising:
   (a) a frame structure;
   (b) one or more enclosure panels mounted on the frame structure, the frame structure and the one or more enclosure panels together defining an enclosure;
   (c) an exhaust duct, disposed internally relative to the one or more enclosure panels, that has an air inlet opening formed therein for receipt of exhaust air from equipment mounted in the enclosure; and
   (d) a plurality of adjustable filler panel assemblies for selectively blocking portions of the air inlet opening in order to create a custom-fit air inlet opening for a particular piece of equipment so that exhaust air from the equipment does not flow back into the enclosure after entering the exhaust duct
   (e) wherein the plurality of adjustable filler panel assemblies each include a first panel and a second panel that are telescopically adjustable relative to one another.

21. The electronic equipment enclosure of claim 20, wherein the internal exhaust duct is substantially the same height as the enclosure.

22. The electronic equipment enclosure of claim 20, wherein the plurality of adjustable filler panel assemblies are of different sizes.

23. A method of customizing air flow in an electronic equipment enclosure, comprising:
  (a) providing a frame structure having one or more enclosure panels mounted thereon, the one or more enclosure panels together defining an enclosure;
  (b) installing an exhaust duct in the enclosure, the exhaust duct having an air inlet opening formed therein for receipt of exhaust air from equipment mounted in the enclosure;
  (c) installing a plurality of adjustable filler panel assemblies, each with a first panel and a second panel that are telescopically adjustable relative to one another, in the enclosure; and
  (d) adjusting a length of the plurality of adjustable filler panel assemblies to selectively block portions of the air inlet opening.

24. The method of customizing air flow in an electronic equipment enclosure of claim 23, wherein the step of installing a plurality of adjustable filler panel assemblies includes installing the adjustable filler panel assemblies in the vicinity of an exhaust grille on a side of a piece of electronic equipment mounted in the electronic equipment enclosure without blocking the exhaust grille, thereby creating a custom-fit air inlet opening for a particular piece of equipment so that exhaust air from the equipment does not flow back into the enclosure after entering the exhaust duct.

* * * * *